(12) United States Patent
Jaeger et al.

(10) Patent No.: US 6,326,956 B1
(45) Date of Patent: Dec. 4, 2001

(54) CIRCUIT CONTROL DEVICES UTILIZING ELECTRONIC DISPLAY SCREEN LIGHT

(75) Inventors: Denny Jaeger; Kenneth M. Twain, both of Oakland, CA (US)

(73) Assignee: Intertactile Technologies Corporation, Oakland, CA (US)

(*) Notice: Subject to any disclaimer, the term of this patent is extended or adjusted under 35 U.S.C. 154(b) by 0 days.

(21) Appl. No.: 09/139,078

(22) Filed: Aug. 24, 1998

(51) Int. Cl.[7] ............................................. G09G 5/00
(52) U.S. Cl. ....................... 345/179; 345/156; 178/19.05
(58) Field of Search ........................... 345/156, 179–184, 345/60; 178/19.01, 19.05, 18.1

(56) References Cited

U.S. PATENT DOCUMENTS

| | | | |
|---|---|---|---|
| 4,695,831 | * 9/1987 | Shinn | 345/180 |
| 5,572,239 | 11/1996 | Jaeger | 345/172 |
| 5,712,661 | 1/1998 | Jaeger | 345/170 |
| 5,774,115 | 6/1998 | Jaeger et al. | 345/172 |
| 5,777,603 | 7/1998 | Jaeger | 345/172 |
| 5,786,811 | 7/1998 | Jaeger | 345/172 |
| 5,805,145 | 9/1998 | Jaeger | 345/172 |
| 5,805,146 | 9/1998 | Jaeger et al. | 345/172 |
| 5,877,752 | * 3/1999 | Puthuff et al. | 345/180 |

* cited by examiner

Primary Examiner—Kent Chang
(74) Attorney, Agent, or Firm—Harris Zimmerman, Esq.

(57) ABSTRACT

A control device provides a variable control signal to electrical apparatus and has a control member, such as a stylus or a turnable or slidable member, that is manipulated to vary the signal. Photoelectric sensors detect and track movement of the control member. The control member is disposed at the face of an electronic image display screen which can display calibration marks, identifying labels, current setting and/or other graphics pertinent to operation of the control device. The display screen also operates as the light source for the photoelectric sensors.

12 Claims, 23 Drawing Sheets

FIG. 32
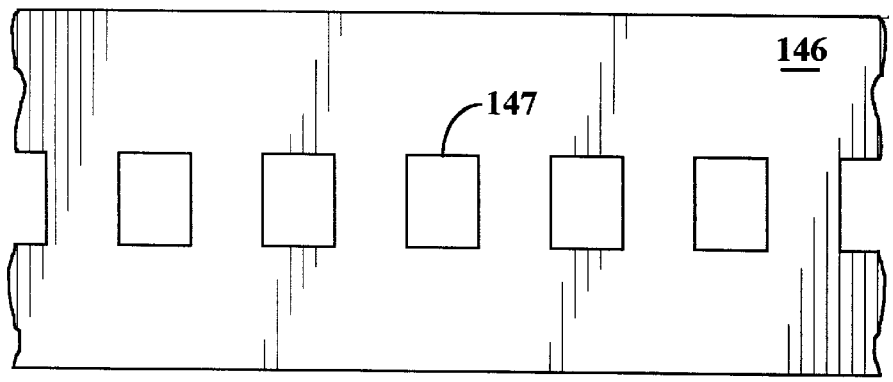
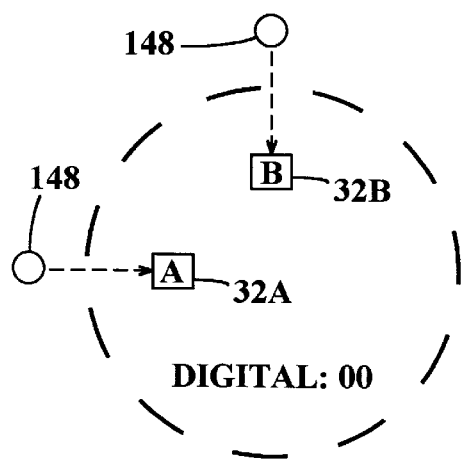
FIG. 33A
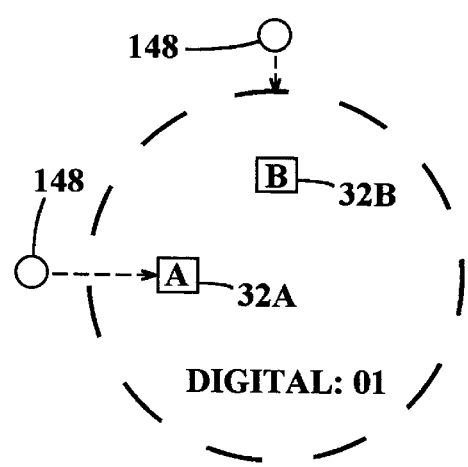
FIG. 33B
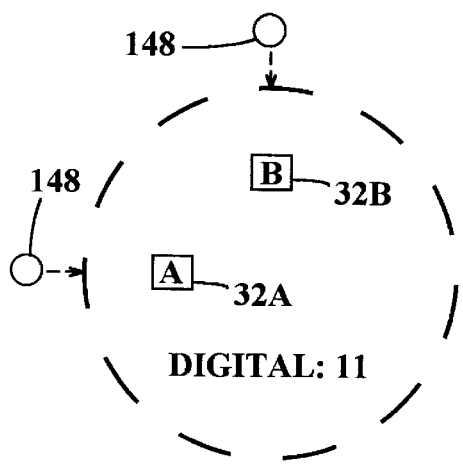
FIG. 33C
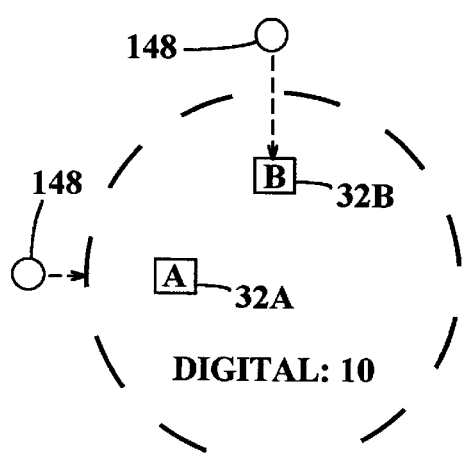
FIG. 33D

FIG. 36
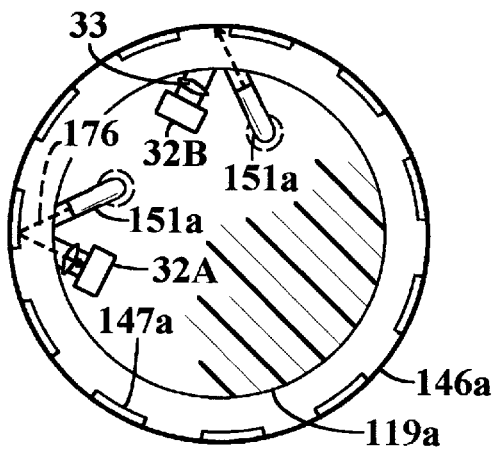
FIG. 35
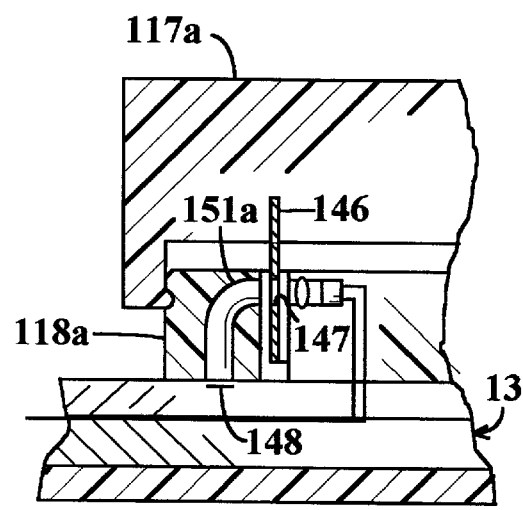
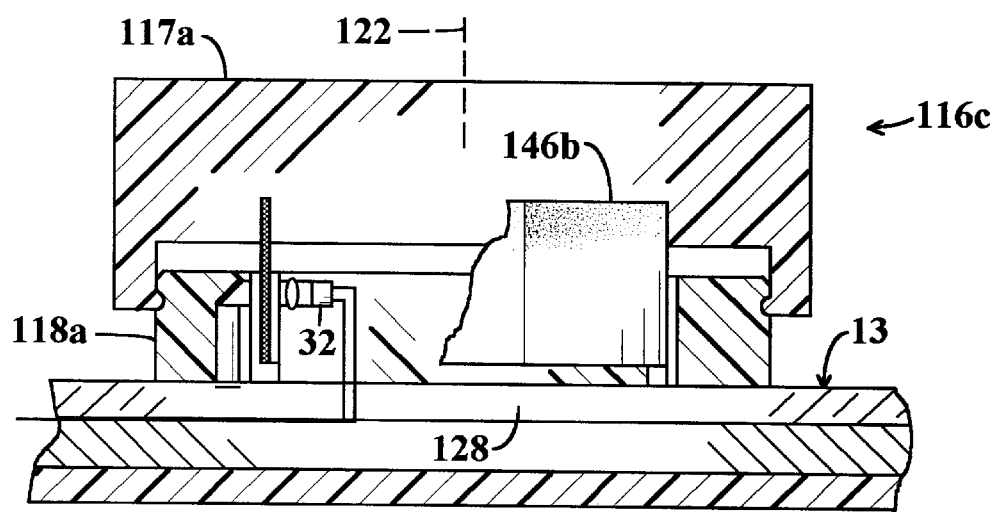
FIG. 37

CIRCUIT CONTROL DEVICES UTILIZING ELECTRONIC DISPLAY SCREEN LIGHT

TECHNICAL FIELD

This invention relates to controls for electrical apparatus and more particularly to circuit controls having electronic image display screens for producing graphics pertinent to operation of the controls.

BACKGROUND OF THE INVENTION

Many devices for controlling electrical apparatus have a moveable member which the operator turns or slides in order to vary a control signal. Typically graphics are present in the vicinity of the moveable member to indicate the function of the control and to identify settings of the control along the path of travel of the member. Traditionally such graphics are permanently imprinted on a control panel or other structural component of the control device.

It has been recognized that it can be advantageous to replace the permanently imprinted graphics with changeable images produced by an electronic display screen particularly in the case of a control device which is used to control different functions of the controlled apparatus during different modes of operation of the apparatus. The display can change the graphics as needed so that they remain appropriate during each of the different control functions.

The function of the electronic display screen has heretofore been limited to that of visually presenting information to the operator, such as calibration marks, current settings, identifying labels and the like. It has not previously been recognized that an electronic display screen may serve other purposes in addition to displaying information to the operator of a circuit control device.

SUMMARY OF THE INVENTION

In one aspect of the invention, a control device for providing a control signal to electrical apparatus has at least one photosensor which detects movement of a moveable member in order to vary the control signal. The control device is disposed in front of an electronic image display screen which can display changeable images conveying information pertinent to operation of the control device. The display screen is also the light source for the photosensor or photosensors.

In another aspect of the invention, the control device further includes a display screen controller conditioned to cause display of a light pattern wherein different locations in the light pattern are viewed by the photosensor as the moveable member is moved through settings thereof. The display screen controller is further conditioned to move a light variation through the locations in the light pattern which light variation is detectable by the photosensor to produce a location sensing signal.

In another aspect of the invention, the moveable member is a stylus having an end that may be placed at a selected location in front of the image display area of the display screen. The photosensor is secured to the stylus and is oriented to view a portion of the image area that is offset the end of the stylus. In another aspect, the end of the stylus defines an axis of rotation about which the stylus may be turned. The photosensor is positioned on the stylus to view selected locations in the image display area that lie along a path which extends around the axis of rotation.

In another aspect of the invention, the moveable member of the control device is a knob which is engaged on a base that is attached to the display screen and which is turnable about an axis of rotation.

In still another aspect of the invention the moveable member is a cap which is slidable along a track, said track and cap being in front of the image display area of the image display screen. A display screen controller is coupled to the display screen and is conditioned to cause display of a light pattern which extends along the track and wherein different locations along the light pattern correspond to different settings of the control device. The photosensor is carried by the cap in position to receive light from the different locations along the light pattern as the cap is moved therealong.

The invention enables photoelectric tracking of movement of the moveable member of a circuit control device using light produced by an electronic display screen which may also display graphics pertinent to operation of the control device. A separate light source is not needed. This eliminates certain hardware components and electrical conductors heretofore needed for photoelectric sensing of control member movement. Depending on the particular type of control device, this variously reduces structural complication and/or bulk and/or manufacturing cost of the control device. In one form of the invention this provides what may be termed virtual control devices in which settings of the control device are identified by images on the display screen and a moveable image identifying the current setting of the control device. The setting may be changed by applying the tip of a stylus to the display screen and then twisting the stylus.

The invention, together with further aspects and advantages thereof, may be further understood by reference to the following description of preferred embodiments and by reference to the accompanying drawings.

BRIEF DESCRIPTION OF THE DRAWINGS

FIG. 32 depicts a portion of a light encoding drum which is a component of the control device of FIGS. 30 and 31.

FIGS. 33A to 33D are diagrammatic depictions of successive stages in a light beam encoding process which occurs in the control device of FIGS. 30 to 32.

FIG. 35 is a section view corresponding to the left side portion of FIG. 31 and illustrating a first modification of the control device thereof.

FIG. 36 is a plan view of a portion of a control device similar to that of FIG. 31 illustrating another modification of the control device thereof.

FIG. 37 is a cross section view corresponding generally to FIG. 31 while illustrating a modification of the circuit control device thereof.

DETAILED DESCRIPTION OF THE PREFERRED EMBODIMENTS

Figure 1:
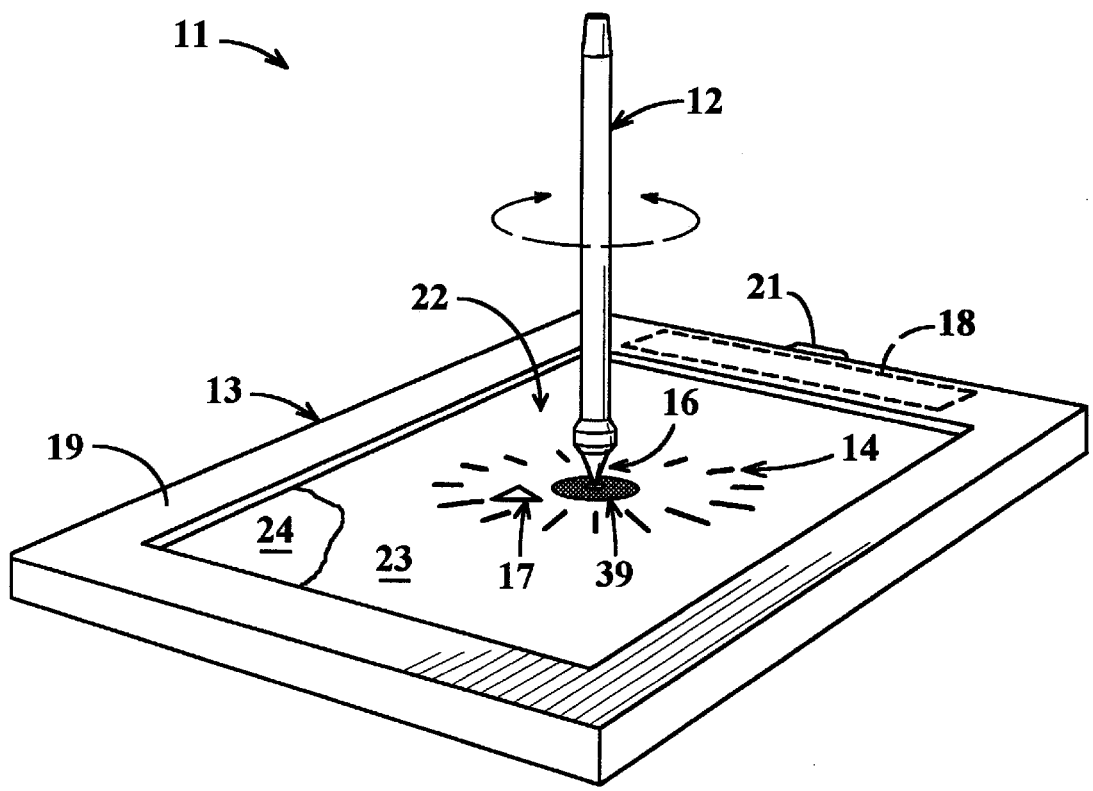
FIG. 1 is a perspective view of a first embodiment of a control device wherein a control signal for electrical apparatus is varied by operator turning of a stylus at the face of an electronic display screen.

In one aspect the invention provides what may be termed virtual control devices as much of the hardware associated with prior circuit control devices is not needed. Referring initially to FIG. 1 of the drawings, a virtual control device 11 of this kind may be used to enable operator control of any of the diverse types of electrical apparatus that respond to control signals that are varied by movement of an operator manipulated control member 12. In this example the operator manipulated control member 12 is a rod shaped stylus that may be gripped in the manner that a pen or pencil is gripped. The stylus 12 coacts with an electronic image display screen 13 which may display images of graphics 14, simulating calibration marks or the like, that identify the different settings of the control device 11 and which are arranged in a circular pattern in this example. The operator places an end 16 of the stylus at or in proximity to the center of the graphics 14 and twists the stylus about its longitudinal axis to vary the control signal which is produced by the control device 11. In this example of the invention, the display screen 13 displays an image of a pointer or other indicator 17 that moves in response to turning of the stylus 12 to identify the currently selected setting of the control device 11.

The electronic image display screen 13 may be of any of the known forms which can display changeable images and may be of conventional internal construction except as hereinafter described. In many cases, the display screen 13 is preferably of the flat panel display type in which an array of minute image pixels can be conditioned to present graphics of any desired configuration. Examples of flat panel displays of this kind are described in prior U.S. Pat. No. 5,572,239 which is herein incorporated by reference.

Electronic circuit components 18 which enable interaction between the stylus 12 and display screen 13 and which will hereinafter be described are, in this example, embedded in the marginal framing region 19 of the display screen. Alternately, such components 18 may be circuit boards disposed against the back of the display screen 13 or may be situated in a housing which is separate from the display screen assembly. In this example, a multi-pin connector 21 at the marginal framing region 19 provides for transmission of the control signals produced by the control device 11 to the controlled circuit. An external connector 21 is not needed in instances where the control device 11 is fastened to the housing or the like of the controlled circuit or in instances where the control signals are transmitted to the controlled circuit by means other than wire conductors such as by radio signals or optical signals for example.

Application of the stylus 12 to the image display area 22 of display screen 13 is detected by a touch screen 23 which overlays the image producing layers 24 of the screen, the touch screen being formed of transparent materials in the known manner. The touch screen 23 may be of any of the known types which produce a touch signal when a stylus or a person's finger contacts the screen or in some cases is simply brought into close proximity to the screen. Touch screens of the resistive or surface wave types require actual contact with the screen. Touch screens of the capacitive type do not. Infrared touch screens respond to interruption of arrays of parallel infrared light beams that extend across the touch sensitive area.

Figure 2:
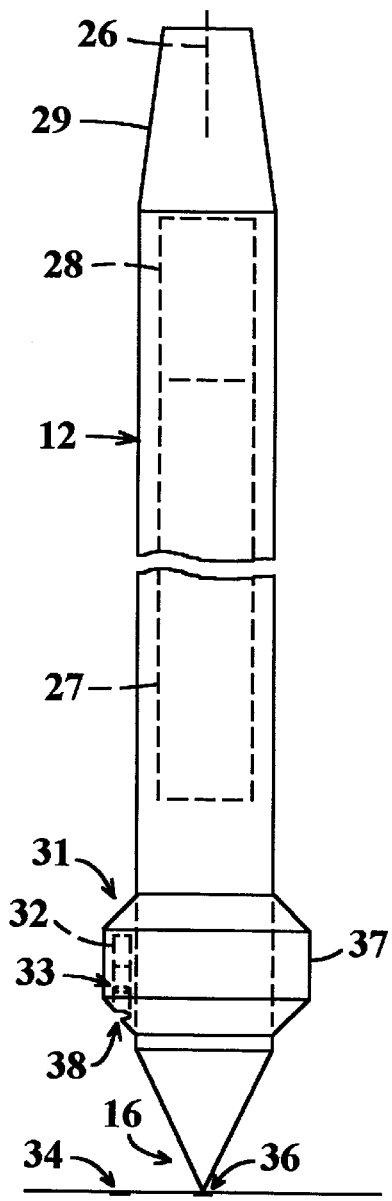
FIG. 2 is a foreshortened side view of the stylus of the control device of FIG. 1.
Figure 3:
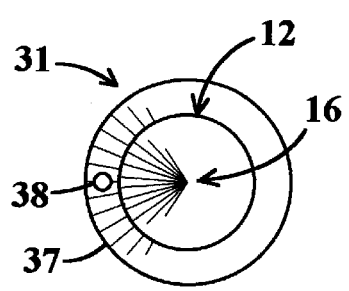
FIG. 3 is a view of the bottom end of the stylus of the preceding figures.

Referring jointly to FIGS. 2 and 3, the lower end 16 of stylus 12 is a pointed tip which establishes a point of contact or near contact with the screen that is situated on the central axis 26 of the stylus which axis is the axis of rotation of the stylus when it is turned to vary the control signal that is produced by the control device. Electronic components 27 of the stylus 12 which will be hereinafter described are contained within a lower portion of the body of the stylus and a battery compartment 28 within the upper portion is accessible by removal of a cap 29 which is screwed onto or snap fitted onto the top of the stylus.

Stylus 12 differs from a pen/stylus of the kind heretofore used for entering written data into touch screens, such as in notebook computers for example, in that it has means 31 for sensing turning of the stylus about the axis of rotation 26 when the stylus is in a more or less upright orientation relative to the screen. In particular, a photosensor 32 and light focusing lens 33 are carried by the stylus 12 and are positioned and oriented to cause the photosensor to view a minute portion 34 of the image display area 22 that is offset from the portion 36 towards which the pointed tip 16 of the stylus is directed. Thus the photosensor 32 responds to light and the absence of light in a portion 34 of the displayed image that is laterally spaced from the axis of rotation 26 of the stylus 12.

Photosensor 32 may be a phototransistor or a photodiode for example and in this embodiment is contained within an annular enlargement 37 which encircles the body of the stylus 12 adjacent to the pointed lower end 16 of the stylus. The photosensor 32 and light focusing lens 33 are contained within a passage 38 which extends up into enlargement 37 in parallel relationship to the axis of rotation 26 of the stylus.

Figure 4:
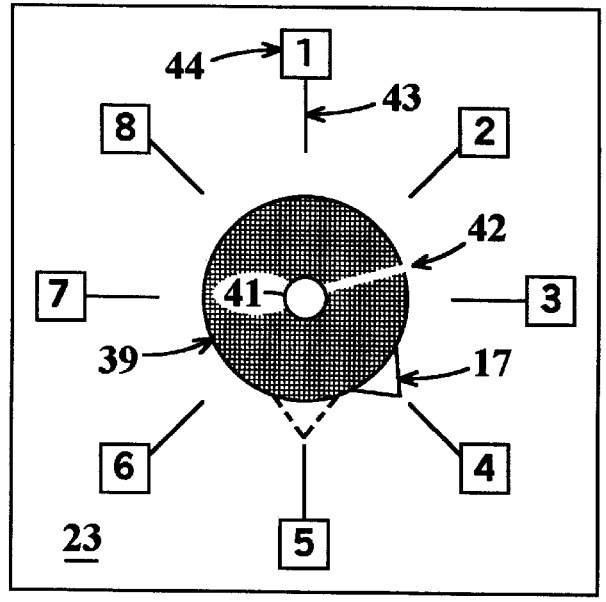
FIG. 4 is a frontal view of one example of graphics which may be displayed at the screen of the electronic display screen of the preceding figures when the control device is configured to operate as a virtual potentiometer, a virtual rotary variable resistor or as a virtual rotary switch.

Referring jointly to FIGS. 2 and 4, the display screen 13 displays a circular light pattern 39 at image display area 22 that enables tracking of angular movement of the stylus 12 while the pointed tip 16 of the stylus is at the center 41 of the light pattern and the stylus is being turned. In this example the light pattern 39 is a black ring having a white center 41 which identifies the target area for the tip of the stylus. As will hereinafter be described in more detail, a touch of the stylus at center 41 causes a radially directed white scan line 42 in the light pattern 39 to rotate about the center 41 at a rapid rate. Passage of scan line 42 under the photosensor 32 initiates a location sensing signal in a manner to be hereinafter described that enables identification of the current angular orientation of stylus 12. In an alternate arrangement the light pattern 39 may have a rotating black radial line in a white background.

The display screen image depicted in FIG. 4 for purposes of example provides for a virtual rotary potentiometer for producing a control signal having a value that increases as the stylus is turned in one direction and which decreases as it is turned in the opposite direction. Specific settings of the control device can be identified by lines 43 and/or other graphics 44 situated around the light pattern 39 which may themselves be portions of the image which is generated by the display screen 13. The image includes the previously described indicator 17 which moves to identify the currently selected setting of the control device. If desired, the screen 13 may display still other information that may be pertinent to operation of the control device or otherwise be of interest to the operator.

Figure 5:
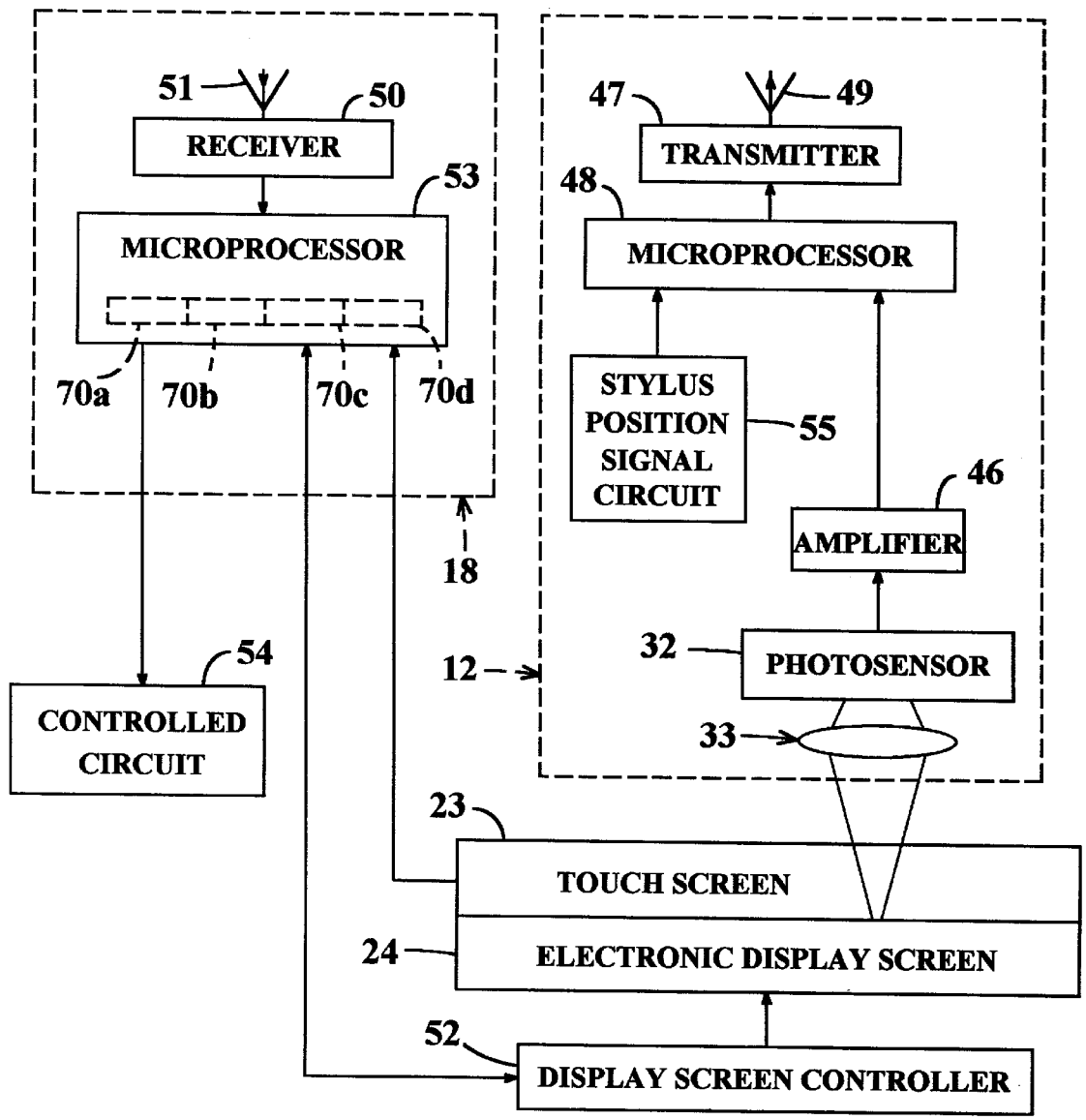
FIG. 5 is a schematic circuit diagram depicting electrical components of the apparatus of the preceding figures.

Referring to FIG. 5, electrical circuit components of the control device that are contained within the stylus are shown enclosed in dashed rectangle 12. Circuit components contained within the display screen framing are shown enclosed by dashed rectangle 18. Within the stylus 12, the output signal of photosensor 32 is a location sensing signal which has a first magnitude when the photosensor is viewing a white area at the image display screen 24 and a second magnitude when it is viewing a black area. This output signal is amplified by an amplifier 46 and applied to a radio transmitter 47 through a digital microcontroller 48. Transmitter 47 has a first antenna 49 which is contained within the stylus 12. The signal is received by a radio receiver 50 having a second antenna 51 which components are within the framing region of the display screen. Radio transmitter 47 and receiver 50 can be replaced by a flexible cord extending from stylus 12 to the framing region of the display screen 13 but radio transmission of the location sensing signals is usually more convenient to the operator.

This particular embodiment of the invention makes use of a pre-existing type of stylus 12 or pen to which the photosensor 32, lens 33 and amplifier 46 have been added. Pre-existing styluses of this kind, used for handwriting data onto a screen for entry into a digital data processor, contain a circuit 55 which applies a stylus position signal to the radio transmitter 47 through the microcontroller 48. In some usages of the present invention it is advantageous to retain this capability of handwriting data into a controlled circuit by use of the stylus 12. This is not necessary in all uses of the present invention and thus the circuit 55 and microcontroller 48 need not be present in all cases. The photosensor signal may be applied to the radio transmitter 47 through an analog to digital converter in instances where no microcontroller 48 is present in the stylus 12.

A display screen controller 52 is coupled to the display screen 24 and may be of one of the known forms that can be programmed or conditioned in a known manner to cause the screen to display any desired image including changing images and images which undergo movement.

Radio receiver 50 applies the location sensing signal from stylus 12 to a digital data processor 53 which in this example is a microprocessor situated in the framing region of the display screen. The data processor 53 also receives the touch signals produced by the previously described touch screen 23 which indicate that an operator has emplaced the tip of the stylus at the screen. Referring jointly to FIGS. 4 and 5, the data processor 53 responds to a touch signal by signaling display screen controller 52 to begin rotation of the previously described scan line 42 in the virtual potentiometer image. Each passage of scan line 42 through the focal point of lens 33 causes photosensor 32 to transmit a location sensing signal to the data processor 53 in the previously described manner. This enables the data processor 53 to determine the current angular orientation of the stylus and to track turning of the stylus by the operator. The data processor 53 sends a virtual pointer signal to the display screen controller 52 which causes the controller to move the previously described pointer image 17 to an angular position around the axis of rotation that identifies the current setting of the control device as determined by operator turning of the stylus.

The virtual pointer signal is a digital signal encoding a value that increases as the stylus is turned in one angular direction and decreases as it is turned in the opposite angular direction. Thus the virtual pointer signal can also be the control signal which is outputted to the circuit 54 which the control device of the present invention is controlling in instances where the controlled circuit responds to control signals in digital form. The control signal may be transmitted through a digital to analog converter in instances where the controlled circuit 54 is of a type which responds to a variable voltage control signal.

The control signal which is outputted by the control device need not necessarily be equal in magnitude to the virtual pointer signal nor vary with the virtual pointer signal in a strictly proportional manner. The data processor 53 can be configured to have an internal look up table in which a control signal value that is to be outputted is assigned to each successive virtual pointer signal value. Thus the control signal can be caused to vary in a linear manner in response to turning of the stylus or to vary in a logarithmic manner or to follow any other desired response curve.

Figure 6A:
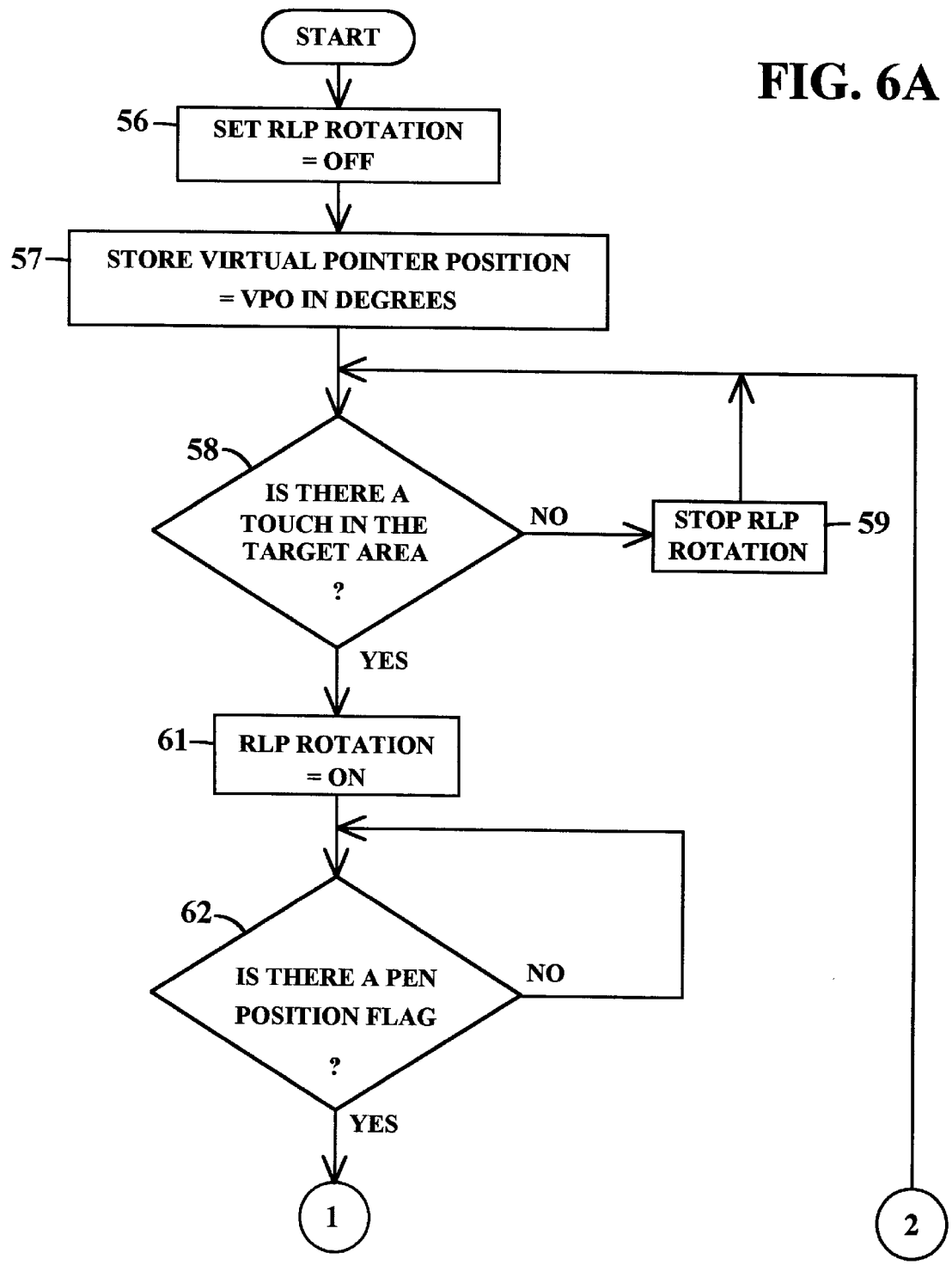
FIGS. 6A and 6B are jointly a flowchart illustrating suitable programming for a data processor component of the apparatus of the preceding figures.
Figure 6B:
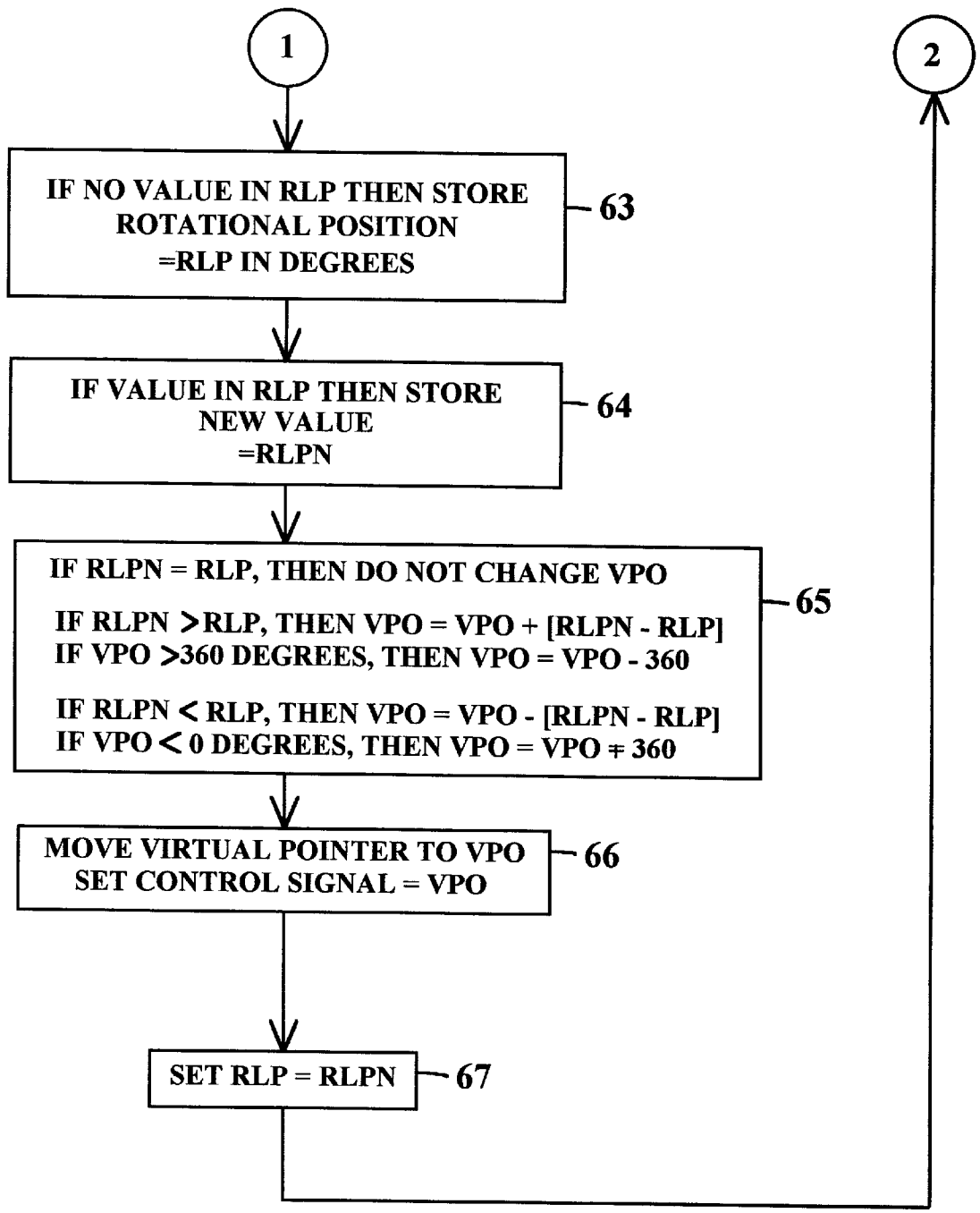

FIGS. 6A and 6B jointly depict programming which enables the data processor 53 to effect the above described operations. Referring jointly to FIG. 4 and FIGS. 6A and 6B, the notation "RLP ROTATION" (Rotating Line of Pixels Rotation) in the flowchart refers to the previously described rotation of scan line 42 in the image which causes the photosensor to transmit a location sensing signal. "RLP" refers to a value which the data processor stores that is indicative of the angular orientation of scan line 42 at the time that the last location sensing signal occurred. "RLPN" refers to a new value for RLP resulting from turning of the stylus by an operator. The notation "VPO" refers to the above discussed virtual pointer signal. "TARGET AREA" refers to the center 41 of the virtual potentiometer image at which the tip of the stylus is emplaced. "PEN POSITION FLAG" refers to the above discussed location sensing signal that is produced by the photosensor.

As indicated at box 56 of the flowchart, the program initially maintains the scan line 42 in a stationary condition and at box 57 stores a virtual pointer position signal which encodes the last detected angular orientation of the virtual pointer 17. At decision box 58 the program repetitively checks for the presence of a touch signal which indicates that an operator is applying the stylus to the target area. If no touch signal is detected the program stops rotation of the scan line 42 if it is currently rotating as indicated at box 59. If a touch signal is detected the program starts rotation of the scan line 42 if it is not already rotating as indicated at decision box 61 and awaits a location sensing signal from the photosensor as indicated in decision box 62. At box 63 the program stores a value RLP when the location sensing signal occurs, which value is indicative of the angular orientation of the scan line 42 at that time, if there is no previous RLP value in storage. If there is already a stored RLP value the program also stores a new value RLPN as shown at box 64 that is indicative of the current angular orientation of the scan line 42.

At that point, as shown in box 65, the program compares the previously stored RLP value and the new RLP value to determine if there is a difference in the two values. If they are the same, the virtual pointer 17 position signal VPO is not changed. If RLPN is greater than RLP, indicating operator turning of the stylus, then the difference between the two values is added to the previous VPO value and 360° is subtracted from the result if the result is greater than 360°. If RLPN is less than RLP then the difference between the two values is subtracted from the previous VPO value and 360° is added to the result if the result is less than 0°.

At box 66, if the VPO value has changed, the program signals the display screen controller 52 to move the virtual pointer image 17 to the angular orientation which corresponds to the new VPO value. The program also adjusts the control signal which is being sent to the controlled circuit 54 to correspond the control signal with the change in the VPO value.

Then, at box 67, the program changes the stored RLP value to a value corresponding to that of the new RLPN value. The program then loops back to decision box 58 and repeats the operations described above with reference to box 58 and subsequent boxes.

Thus, with reference again to FIG. 5, the program provides digital data processing means 70a for storing a changeable first value which identifies the last operator selected one of the control device settings, means 70b for varying the control signal in response to variation of the first value, means 70c for storing a changing second value which is indicative of the current position of the scan line along its circular path and means 70d for conforming the first value with the second value in response to the location sensing signals.

Figure 7:
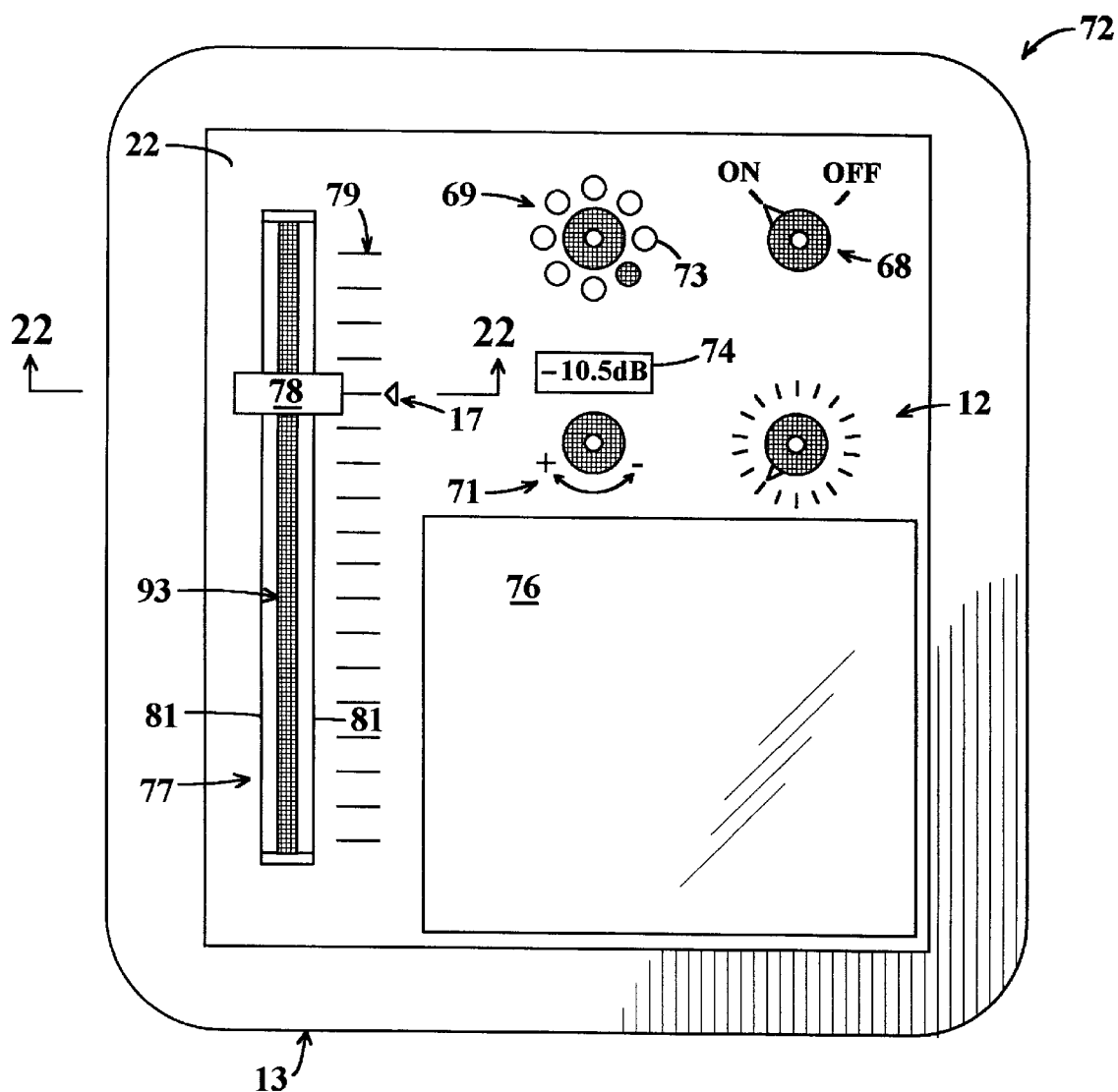
FIG. 7 is a frontal view of a control panel for electrical apparatus which provides a plurality of virtual control devices of the general type shown in the preceding figures and which also uses light produced by the display screen for photoelectric detection of movement of a slidable control by an operator.

Many types of electrical apparatus require a plurality of controls that produce a plurality of control signals. Referring now to FIG. 7, additional control signals for one or more controlled circuits can be produced by providing additional virtual control images of the previously described type, such as virtual control images 68, 69 and 71, at an electronic image display screen 13. The same stylus may be used to operate the several controls. The touch screen 23 enables the digital data processor to determine which control is being adjusted at any given time.

The images or graphics at the several virtual controls of the control panel 72 are not necessarily similar to the graphics 12 which have been previously described. Virtual control 68, for example, does not have a pointer shaped moveable indicator to identify the current setting of the control. Rather, successive settings of the control 68 are identified by a series of angularly spaced circle images 73 and the display screen controller is conditioned to darken the circle which represents the currently selected setting of the control. If the display screen 13 is of the polychromatic type, the circle or the like at the selected setting may be caused to display a different color than the others. The virtual control image does not necessarily have a circular array of setting identifiers centered on the axis of rotation of the stylus. For example, virtual control 69 displays graphics appropriate for use of the virtual control as a two position on/off switch for the controlled circuit. Virtual control 69 displays a readout window 74 at which the current setting of the control is displayed, the control being a volume control for an audio system in this example. If desired, the display screen controller can be conditioned to erase the virtual controls 12, 68, 69 and 71 from the screen 13 in response to a stylus touch at a particular location on the screen and to return the virtual control images in response to a subsequent touch.

In some instances it can be advantageous to provide the control panel 72 with a screen area 76 which has optical character recognition capabilities which screens are used in notebook computers or the like. This enables handwritten entry of data into a controlled circuit using the previously described stylus.

Figure 8:
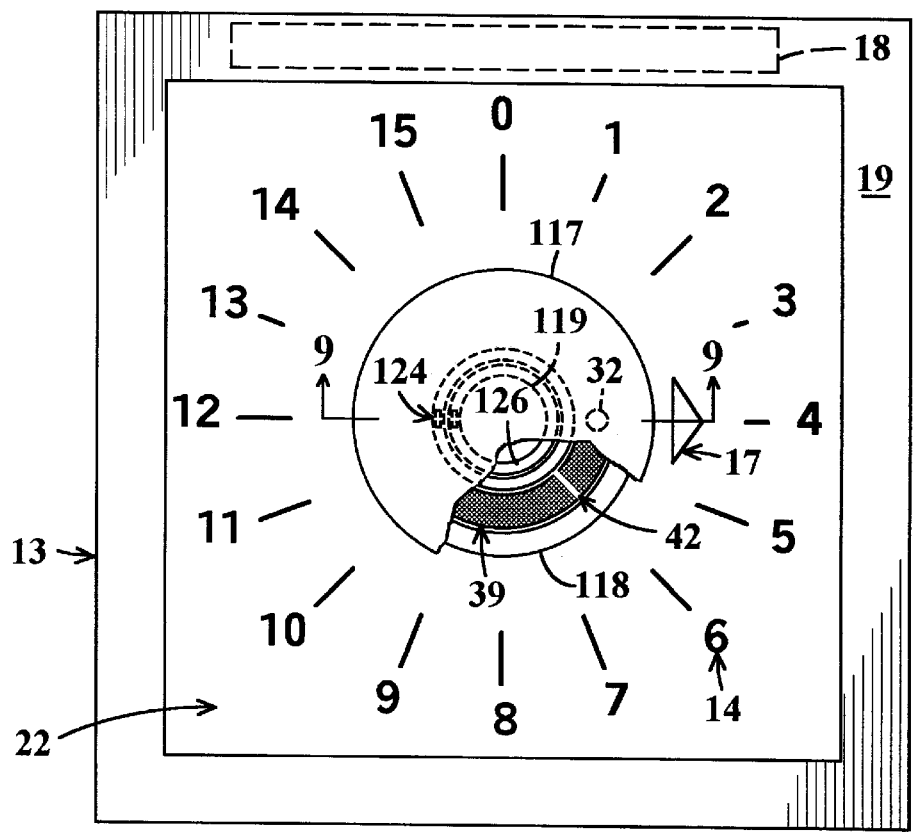
FIG. 8 is a frontal view of a control device for electrical apparatus in which light produced by an electronic display screen is used to track operator turning of a turnable knob.
Figure 9:
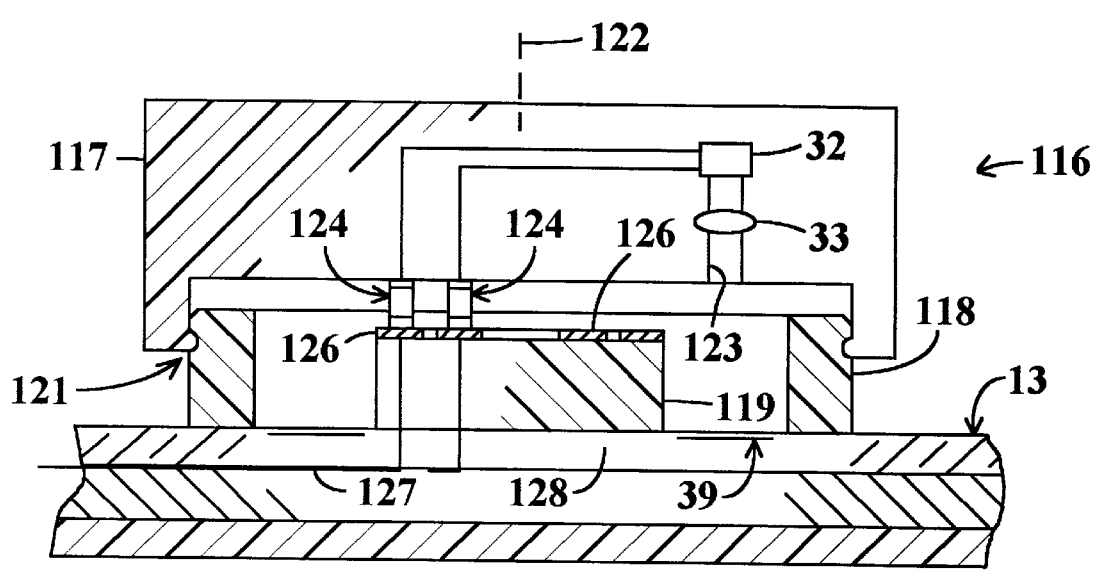
FIG. 9 is a cross section view taken along line 9—9 of FIG. 8.

The concept of using light generated by an electronic display screen to track movement of an operator manipulated member is not limited to virtual controls of the above described stylus operated type. Referring jointly to FIGS. 8 and 9, a display screen 13 similar to that previously described may be used for this purpose in conjunction with a control device 116 at which the operator varies a control signal by turning a rotatable knob 117. The knob 117 is disposed in front of the image display area 22 of display screen 13 over an annular outer base member 118 which is adhered or otherwise fastened to the face of the screen. An inner base member 119, also adhered or otherwise fastened to the base of the screen 13, provides for electrical connections to the turnable knob 117 as will hereinafter be described. Knob 117 has a snap engagement 121 with the outer base member 118 in this particular example but may be attached to a base in any of the other known ways which enable rotation of a knob relative to a base.

Display screen 13 displays a circular light pattern 39 similar to that previously described which is centered on the axis of rotation 122 of knob 117 and which has a radially directed contrasting scan line 42 that revolves around the axis of rotation at a rapid rate. Light pattern 39 has a diameter which situates it between the outer base member 118 and inner base member 119. A photosensor 32 of the previously described kind is embedded in knob 117 at a location which is offset from the axis of rotation 122. Photosensor 32 receives light from the currently underlying area of light pattern 39 through a focusing lens 33 situated in a passage 123 in the knob which is directed towards light pattern 39. Thus the photosensor 32 produces a location sensing signal in the previously described manner each time that the scan line 42 passes through the viewing aperture established by lens 33.

Electrical connections to the photosensor 32 are provided by a pair of wiper contacts 124 which extend outward from the back of knob 117. Each wiper contact 124 rides against a separate one of a pair of annular conductive bands 126 of differing diameter which are secured to the inner base member 119 and which are in coaxial relationship with the axis of rotation 122 of knob 117. Conductors 127 connect the bands 126 with other components of the electronic circuit 18 of the control device 116 which are in the framing region 19 of the display screen 13. Conductors 127 are preferably formed of transparent conductive material such as indium tin oxide and are preferably at the back of the transparent cover plate 128 which forms the outermost layer of the display screen 13.

Figure 10:
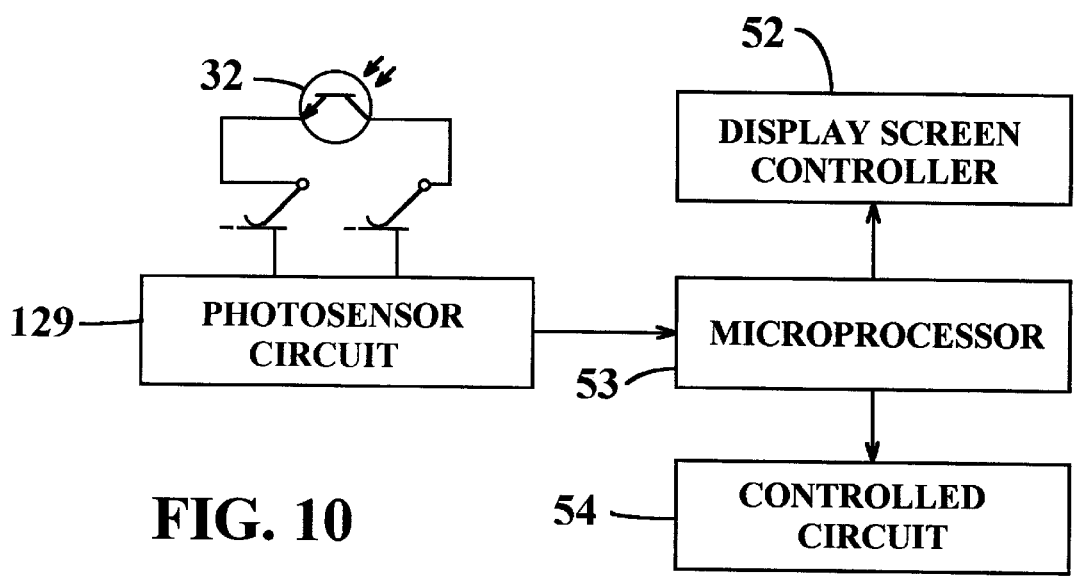
FIG. 10 is a schematic circuit diagram showing electrical components of the control device of FIGS. 8 and 9.

The electrical circuit of the control device 116 may be similar to only a portion of the circuit previously described with reference to FIG. 5 as this example of the control device 116 does not include the touch screen of the previously described embodiment nor the radio components for transmitting signals. Thus, with reference jointly to FIGS. 9 and 10, the photosensor circuit 129 of control device 116 delivers the location sensing signal originated at photosensor 32 to a digital data processor which is a microprocessor 53 in this example. Microprocessor 53 controls cycling of the light pattern 39 at the display screen 13 and delivers a control signal to the controlled circuit 54 in a manner essentially similar to that previously described in connection with the embodiment of FIGS. 1 to 6B. Suitable programming of the microprocessor 53 for this purpose is shown in flowchart form in FIG. 11.

Figure 11:
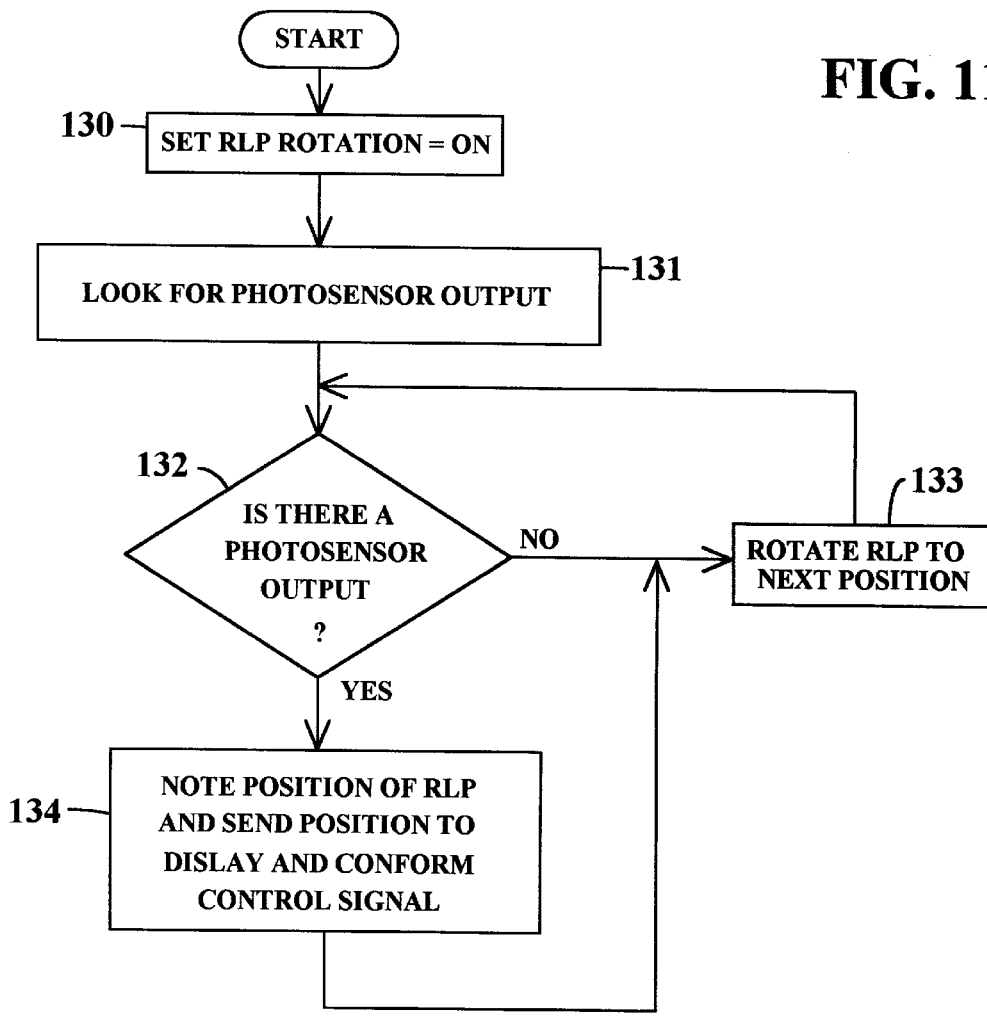
FIG. 11 is a flowchart depicting suitable programming for a digital data processor component of the circuit of FIG. 10.

In FIG. 11 the notation "RLP" (Rotating Light Pixels) again refers to the radially directed scan line 42, shown in FIG. 8, which repetitively travels around the light pattern 39. Referring again to FIG. 11, the program begins rotation of the scan line at start up as indicated at box 130 and repetitively checks for a location sensing signal from the photosensor as indicated at boxes 131 and 132. Following each such check, the program rotates the scan line incrementally to its next position as indicated at box 133. If a location sensing signal is received from the photosensor then, as indicated at box 134, the program stores the current position of the scan line, sends this information to the display screen controller and conforms the magnitude of the control signal which is outputted by the control device with the current position of the scan line.

Referring again to FIG. 8, the display screen controller is conditioned to cause display of a pointer image 17 which turns with knob 117 to indicate the current setting of the control device 116. Graphics 14 which identify the successive settings of the control device may in some cases be permanently imprinted but are preferably also changeable images produced by the display screen. This allows the graphics 14 to change if the control device 116 is a multifunction device that is used to provide different control signals to the controlled circuit during different modes of operation of the circuit.

Figure 12:
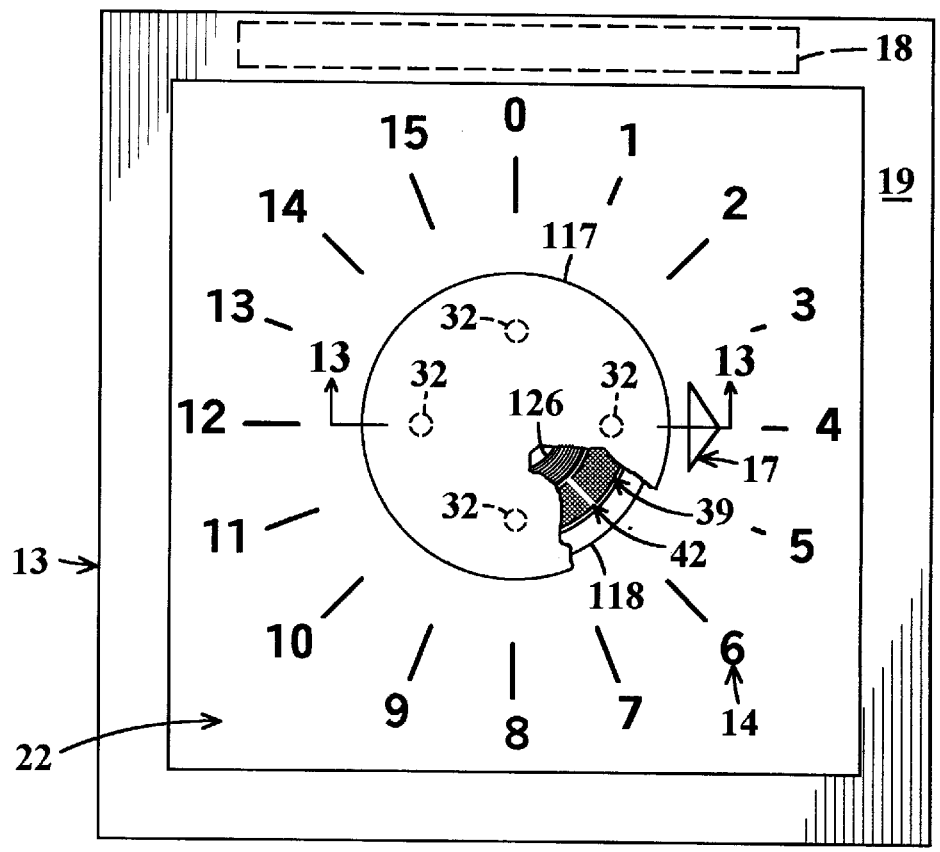
FIG. 12 is a front view of a modification of the control device of FIGS. 8 and 9 which uses a plurality of photosensors to provide for faster response to changes of the setting of the control device.
Figure 13:
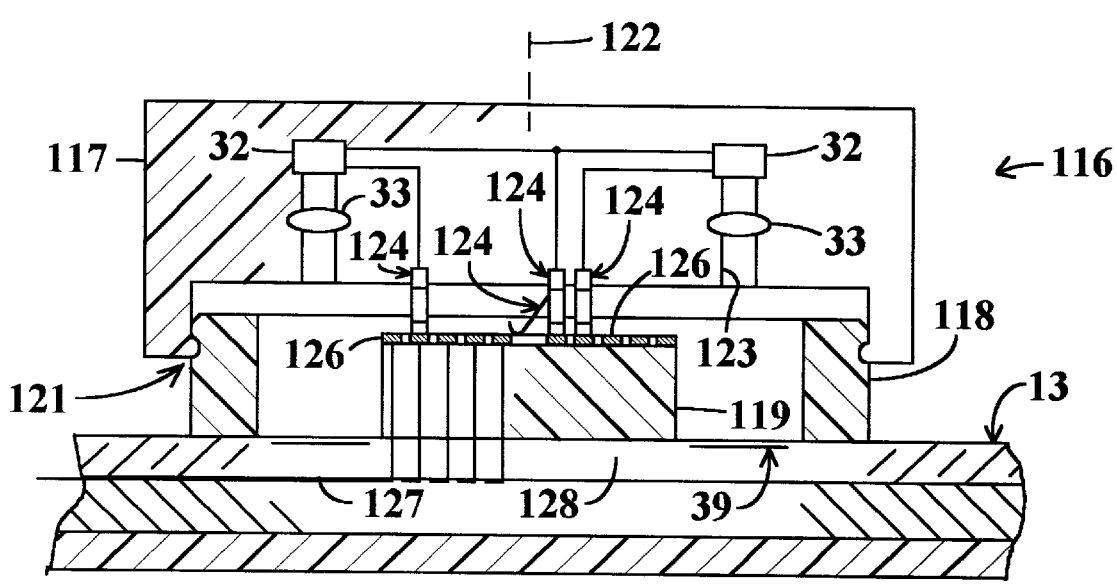
FIG. 13 is a cross section view taken along line 13—13 of FIG. 12.

The time required for the control device 116 to detect and react to movement of the knob 117 can be decreased by providing additional photosensors 32 as shown in FIGS. 12 and 13 which photosensors are angularly spaced apart around the axis of rotation 122 of the knob. There are four photosensors 32 in this particular example although a lesser or greater number can be provided depending on the response speed which is desired. An additional wiper contact 124 and conductive band 126 is provided for each additional photosensor 32 in order to connect the photosensors to the electronic circuit 18 at the framing region 19 of the flat panel display 13.

The construction of the control device 116 can be modified in a way which does not require that electronic components such as photosensor 32 be in the knob 117 and which eliminates the need for sliding wiper contacts 124. In particular, with reference to FIGS. 14 and 15, the photosensor 32 may be mounted on the stationary inner base member 119*a* at the axis of rotation 122 of knob 117 in an orientation at which the photosensor faces the knob. A linear light pipe 136 or fibre optic extends radially within a light pipe disk 137 which forms the back portion of the knob 117. Light pipe 136 extends from an opening 135 at the center of disk 137 to a passage 138 in the disk that is offset from the axis 122 of knob rotation and which is directed towards the previously described light pattern 39 that is displayed by display screen 13. A lens 33 in passage 138 views an underlying small area of the light pattern 39 and directs light from that area to a first mirror 139 that redirects the light into the radially outermost end of light pipe 136. A second mirror 141 at the opposite end of the light pipe 136 reflects the light to photosensor 32 through another focusing lens 142 situated at the face of the photosensor. Thus the photosensor 32 receives a light pulse and initiates a location sensing signal each time that the rotating scan line 42 passes through the viewing aperture of lens 33. Except as described above the control device 116*a* may be similar to the control device 116 previously described with reference to FIGS. 8 to 11 and may operate in a similar manner.

Figure 14:
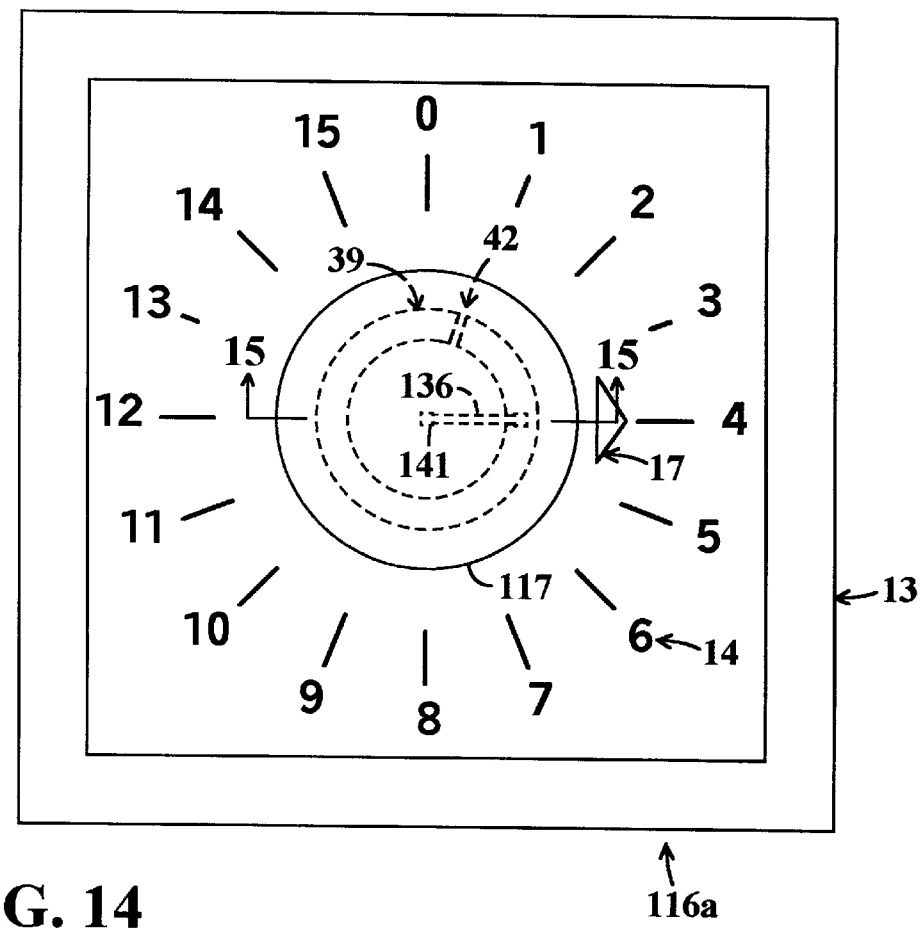
FIG. 14 is a frontal view of another control device for electrical apparatus in which light produced by an electronic display screen is used to track operator turning of a turnable knob.
Figure 15:
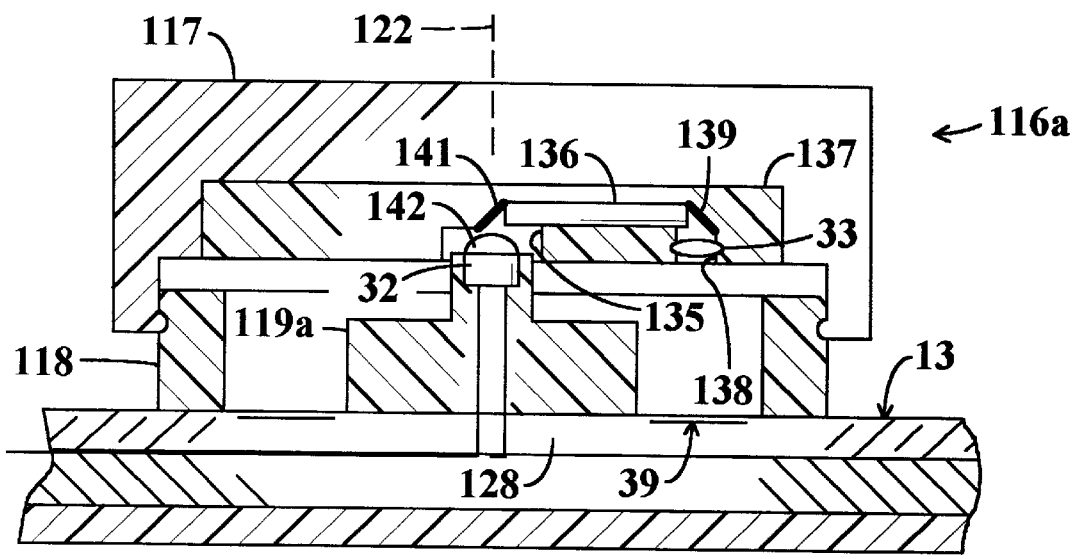
FIG. 15 is a cross section view taken along line 15—15 of FIG. 14.
Figure 16:
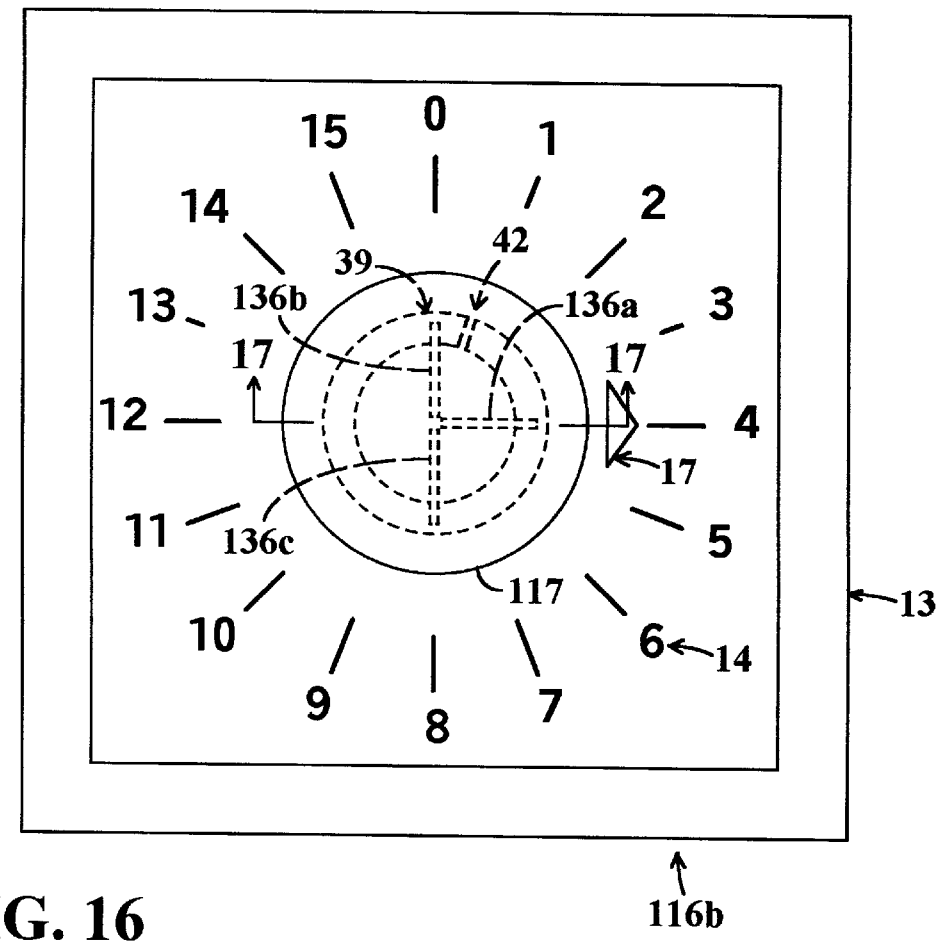
FIG. 16 is a frontal view of still another control device for electrical apparatus in which light produced by an electronic display screen is used to track operator turning of a turnable knob.
Figure 17:
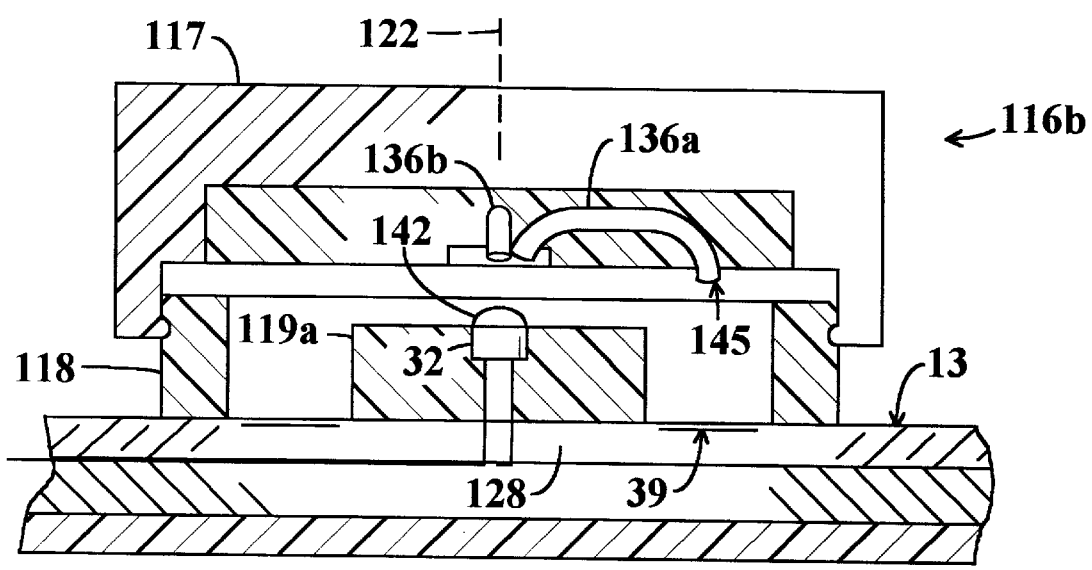
FIG. 17 is a cross section view taken along line 17—17 of FIG. 16.

The mirrors 139 and 141 of the control device 116*a* of FIGS. 14 and 15 are not needed if the linear light pipe 136 is replaced with a curved light pipe 136a as shown in FIGS. 16 and 17. The curved light pipe 136a has a radially outermost end 145 which curves towards the display screen 13 in order to receive light from an underlying small area of the light pattern 39. The opposite end of the light pipe 136a curves towards lens 142 and photosensor 32 to deliver the light to the photosensor. In this modification, the lens 142 and photosensor 32 are secured to the inner base member 119b at a location which is spaced apart from the light pipe disk 137b and are again centered on the axis of rotation 122 of the knob 117.

With continued reference to FIGS. 16 and 17, resolution of the control device 116b with respect to detecting small degrees of turning of the knob 117 can be increased by providing additional light pipes, there being three light pipes 136a, 136b and 136c in this example. This allows the data processor to average three separate readings for each revolution of the scan line. The angular orientation of the three light pipes 136a, 136b and 136c relative to the axis of rotation 122 is non-symmetrical. In this example light pipe 136a extends at a 90° angle relative to both light pipes 136b and 136c while the angular spacing of light pipes 136b and 136c relative to each other is 180°. Consequently the three location sensing signals that originate during each scan line revolution are closer together in time then the three signals which originate in the previous scan line revolution or in the following scan line revolution. This allows the data processor to determine which three location readings are to be averaged for each scan line revolution.

Except as described above the control device 116b of FIGS. 16 and 17 may be similar to the control device 116 previously described with reference to FIGS. 8 to 11 and may operate in a similar manner.

Figure 18:
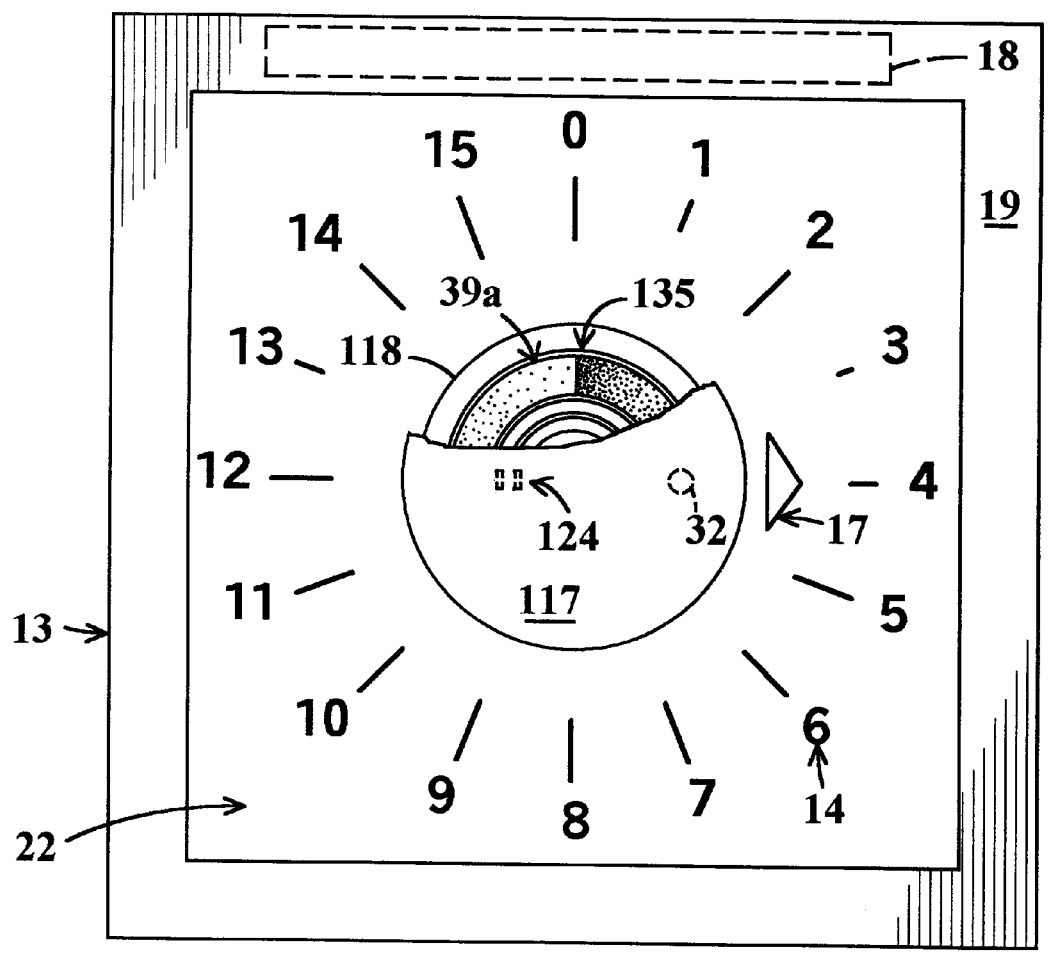
FIG. 18 is a broken out front view of a variation of the control device of FIGS. 8 and 9 in which turning of a knob is tracked using a different form of light pattern display.

Use of a light pattern produced by an electronic display screen to track turning of a knob is not confined to light patterns through which a scan line is repetitively swept in the previously described manner. FIG. 18 depicts a control device 116c which may have a physical construction similar to that of the embodiment previously described with reference to FIGS. 8 and 9 but in which the light pattern 39c which is viewed by the photosensor 32 differs from that of the previously described embodiment. In the embodiment of FIG. 18 the annular light pattern 39c is darkest at a particular location 135 in the band of light and which becomes progressively brighter at successive locations around the band. Thus the location sensing signal produced by the photosensor 32 has a magnitude that is dependent on the angular orientation of the knob 117 and which thereby identifies the current setting of the knob. The output signal of photosensor 32 may be amplified for use as the control signal which is produced by the control device 116c or the microprocessor may programmed to produce a control signal which varies in any desired manner in response to changes in the photosensor signal.

Figure 19:
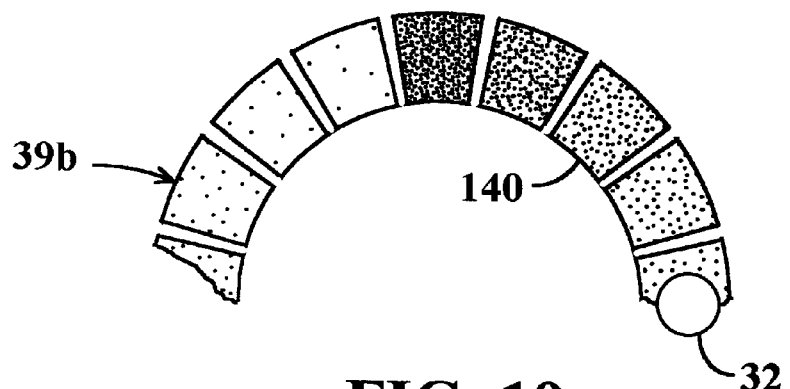
FIG. 19 depicts another form of light pattern display which may be used in the control device of FIG. 18.

The brightness of successive locations in the light pattern 39a need not necessarily vary continuously in the above described manner. FIG. 19 depicts an alternate light pattern 39b which is particularly suited for control devices having a limited number of settings. Light pattern 39b has a series of angularly spaced apart areas 140 each of which has a different brightness and each of which is positioned to be viewed by the photosensor 32 when the control device is at a different one of its settings.

Figure 20:
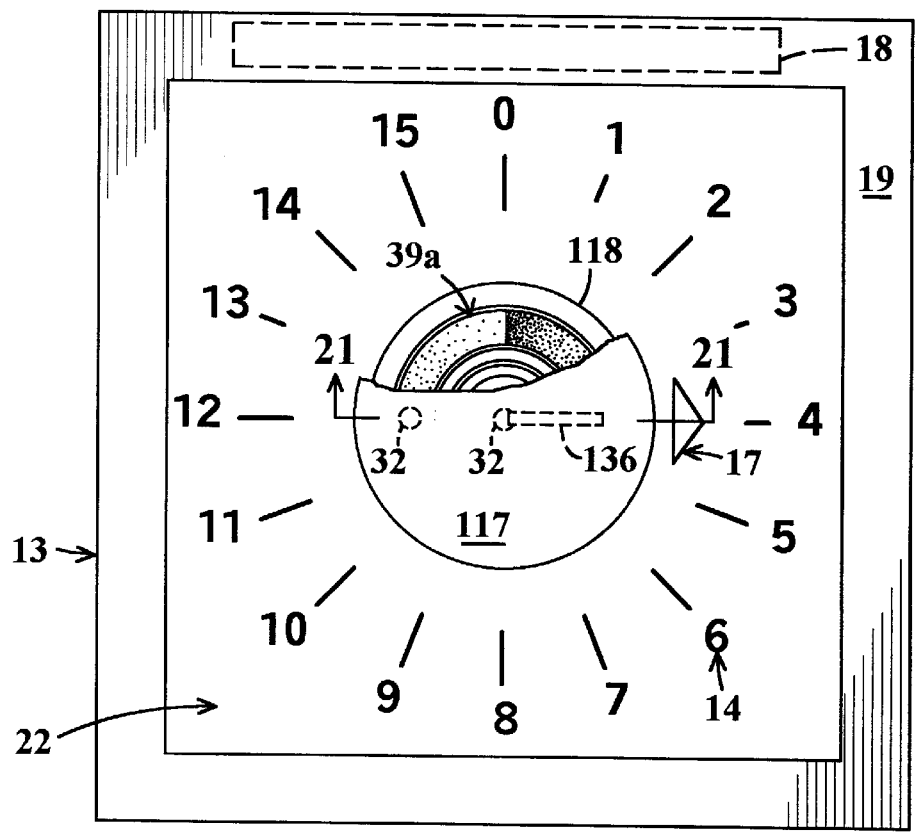
FIG. 20 is a front view of another control device of the general type shown in FIG. 18 and which has added components for increasing precision of detection of the angular orientation of a turnable knob.
Figure 21:
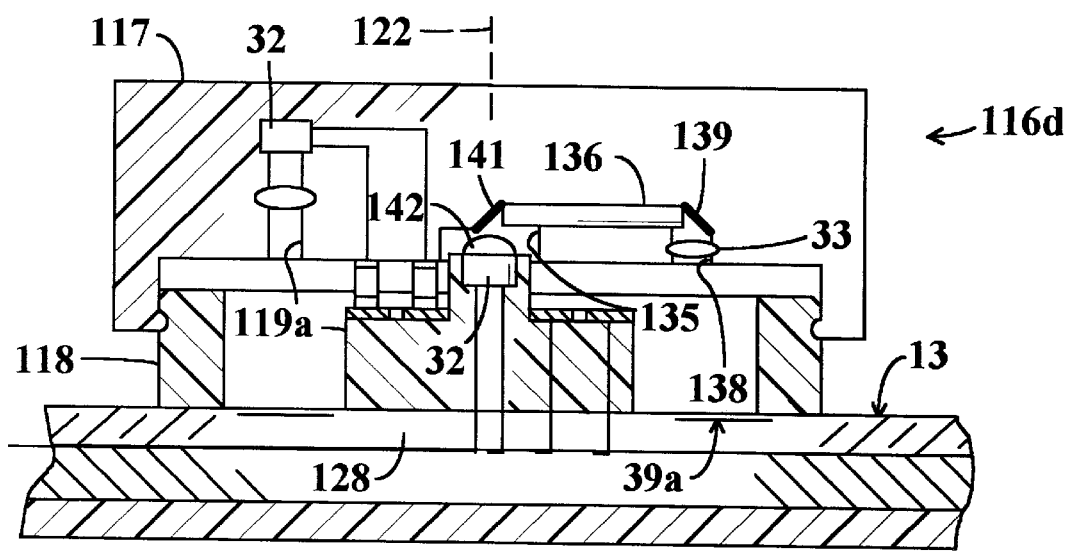
FIG. 21 is a cross section view taken along line 21—21 of FIG. 20.

Accuracy of a control device of the type previously described with reference to FIG. 18 can be enhanced by providing one or more additional photosensors which view one or more different locations in the annular light pattern 39a. This provides one or more supplementary location sensing signals for validating the primary location sensing signal produced by the photosensor 32. One example of a control device 116d of this kind is shown in FIGS. 20 and 21. The control device 115d has a first photosensor 32a positioned in the turnable knob 117 to view the light pattern 39a in an arrangement similar to that previously described with reference to the embodiment of FIGS. 8 and 9. A second photosensor 32b of the embodiment of FIGS. 20 and 21 is situated at the center of an inner base member 119a and views the light pattern 39a through mirrors 139 and 141 in an arrangement similar to that previously described with reference to the embodiment of FIGS. 14 and 15.

The previously described embodiments of the invention all make use of light produced by an electronic display screen to track movement of a member that is rotated by an operator. The concept is also applicable to control devices at which the operators slides a member along a linear path. Referring again to FIG. 7, the previously described control panel 72 is provided with another control device 77 which is of the linear potentiometer or fader type. In a control device of this type the operator selectively varies a control signal by sliding a fader cap 78 along a linear path of travel. In the present instance the path of travel extends along the face of the image display screen 13 within the image display area 22. Markings 79 identifying successive settings of the control device 77, if needed, can be changeable images displayed by the screen 13.

Figure 22:
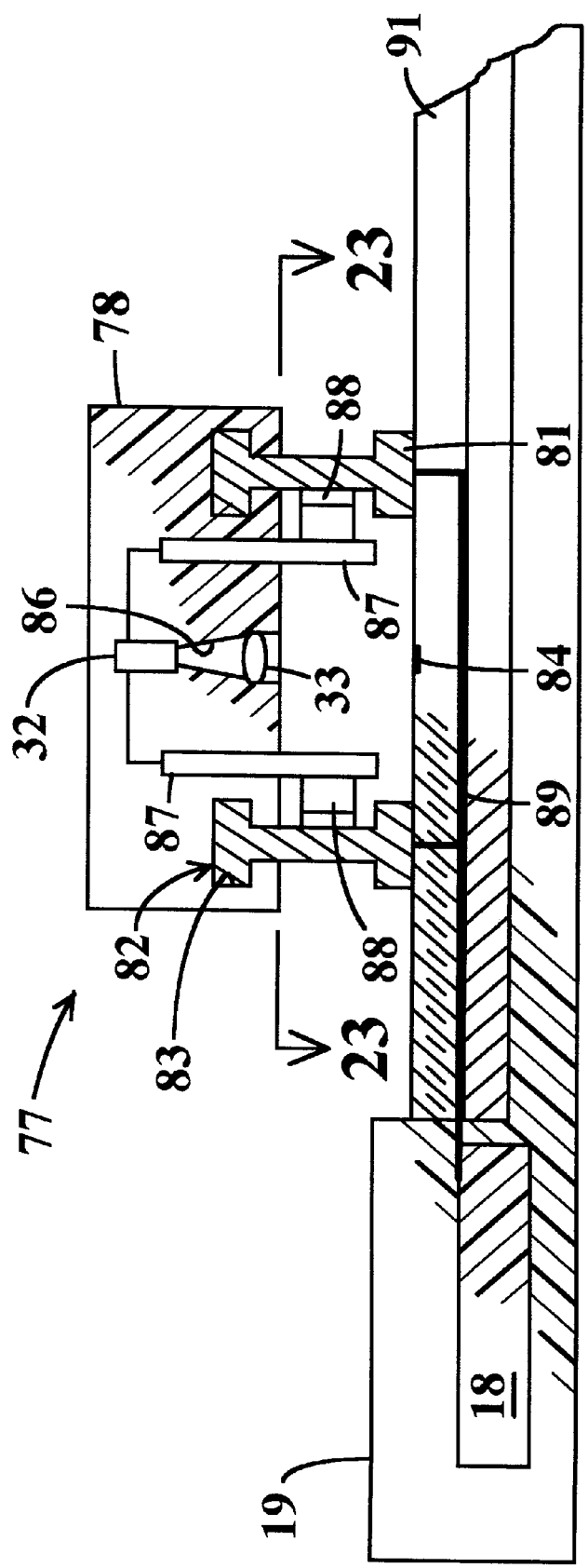
FIG. 22 is a cross section view taken along line 22—22 of FIG. 7 and showing a control device in which light produced by an electronic display screen is used to track operator movement of a slidable fader cap.

Referring jointly to FIGS. 7 and 22, cap 78 travels along a pair of spaced apart parallel rails 81 which are secured to the face of the display screen 13 by adhesive or other means. Laterally enlarged outer portions 82 of the rails 81 extend through conforming passages 83 in the cap 78 to retain the cap on the rails. A photosensor 32 is situated within cap 78 at a location which is between rails 81 and views an underlying small area 84 of the display screen through a passage 86 in the cap which contains a light focusing lens 33. Rails 81 are formed of, or at least coated with, electrically conductive metal thereby enabling use of the rails to connect the photosensor 32 with other circuit components situated in a circuit board 18 situated in the marginal framing region 19 of the display screen 13. The photosensor 32 is connected across two conductive pins 87 which protrude from the underside of the cap 78 preferably at locations which are between the two rails. A flexible wiper contact 88 extends from each pin 87 and rides against the inner side of the adjacent one of the two rails 81. In instances where the rails 81 do not extend to the marginal framing region 19 of the display screen, transparent conductors 89 extend from each rail 81 to the circuit board 18 at the framing region preferably beneath the transparent cover plate 91 which forms the outermost layer of the display screen.

Figure 23:
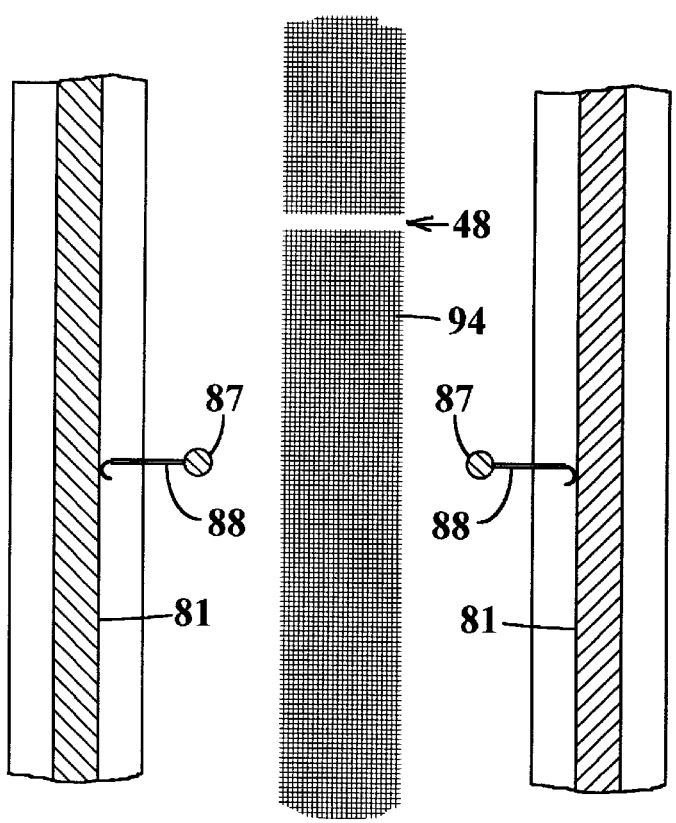
FIG. 23 is a plan section view taken along line 23—23 of FIG. 22.
Figure 24:
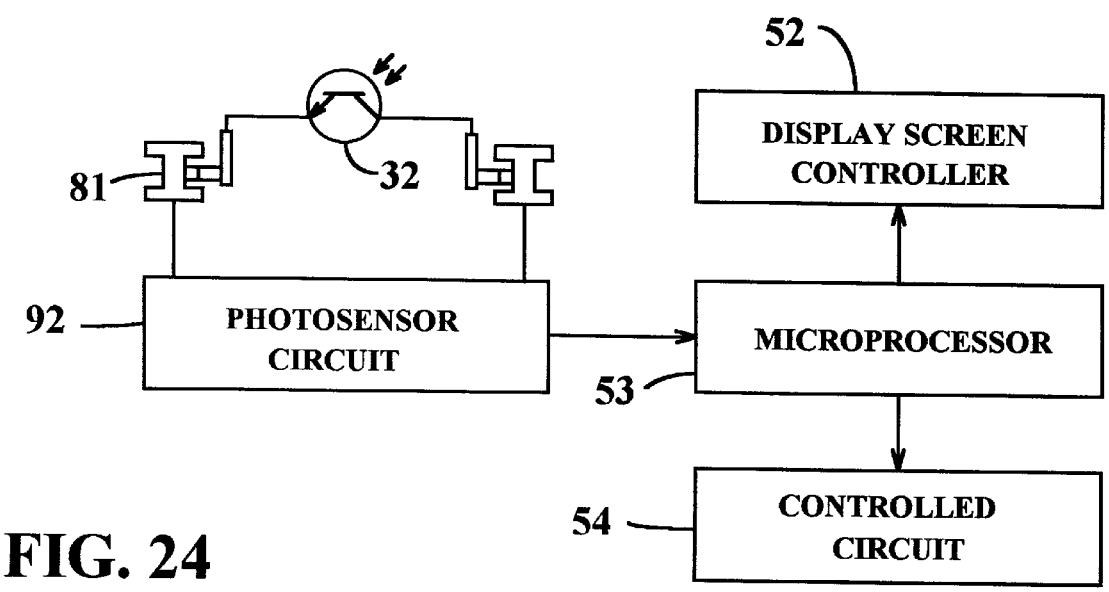
FIG. 24 is a schematic circuit diagram showing electrical components which interact with the slidable control of the control device of FIGS. 22 and 23.

Referring jointly to FIGS. 23 and 24, the output signals from the photosensor circuit 92 are received by a digital data processor which is a microprocessor 53 in this example. Microprocessor 53 is coupled to the display screen controller 52 and delivers the control signal to the controlled circuit 54 in the manner previously described with reference to the embodiment of FIGS. 1 to 6. Referring again to FIGS. 23 and 24, the display screen controller 52 is conditioned to cause display of a linear light pattern 93 that extends along the face of the display screen between rails 81 in position to be viewed by the photosensor 32. A transversely directed scan line 94 is displayed within the light pattern 93 that repetitively moves from one end of the light pattern to the other end. Light pattern 93 is black and line 94 is white in this example although the pattern may be white and the line black in an alternate arrangement.

Each passage of the moving line 94 through the field of view of photosensor 32 causes the photosensor circuit 92 to deliver a location sensing signal to microprocessor 53. This enables the microprocessor 53 to determine the momentary location of the photosensor 32 and to adjust the control signal which is sent to the controlled circuit 54 to accord with the current position of the photosensor. Programming of the microprocessor 53 for this purpose may be as depicted in FIG. 25.

Figure 25:
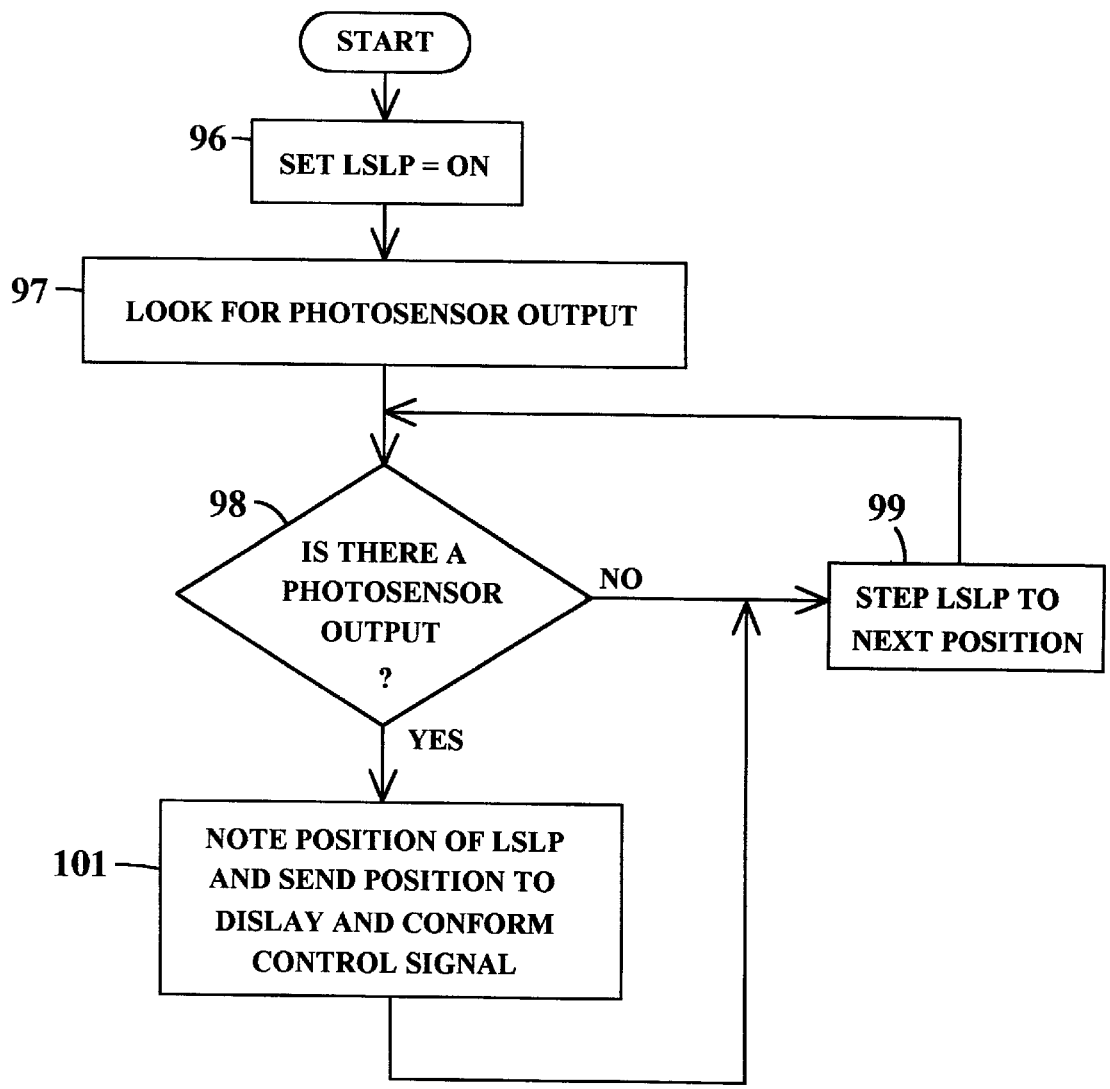
FIG. 25 is a flowchart illustrating suitable programming for a data processor component of the apparatus of FIGS. 22 to 24.

The notation "LSLP" (Linearly Stepping Light Pixel Bar) in FIG. 25 refers to the previously described moving scan line 94. As indicated at box 96 in FIG. 25, the moving line is displayed following start up and as indicated at decision box 97 the program then checks to see if a location sensing signal (i.e. photosensor output) is being produced as indicated at decision box 98. If there is no location sensing signal the program steps the moving line incrementally to its next position as indicated at box 99 and again checks to see if a location sensing signal is being produced. If a location sensing signal is detected at decision box 98 then as indicated at box 101 the program notes and stores the momentary position of the moving line, sends the position to the display screen controller and conforms the magnitude of the control signal which is being produced by the control device with that position. The program then again steps the moving line incrementally to its next position as indicated at box 99 and continues to check for the next location sensing signal as indicated at decision box 98.

Referring to FIGS. 22 and 23, some uses of the sliding cap type of control device 77 require that the control have only a small number of settings. In such usages, a sizable movement of the cap 78 can occur between each setting and it is not necessary that the system be able to detect and respond to relatively small adjustments of the cap. In other instances it is desirable to detect very small movements of the cap 78 and that the recognition of cap movement occur as rapidly as possible. This enables outputting of a close approximation of a continuously variable control signal as opposed to a stepped control signal. Resolution of the control device 77 with respect to cap movement and the recognition time can be optimized by minimizing the width of the scan line 48 and by minimizing the viewing aperture 84 of photosensor 32 which is established by lens 33.

Figure 26:
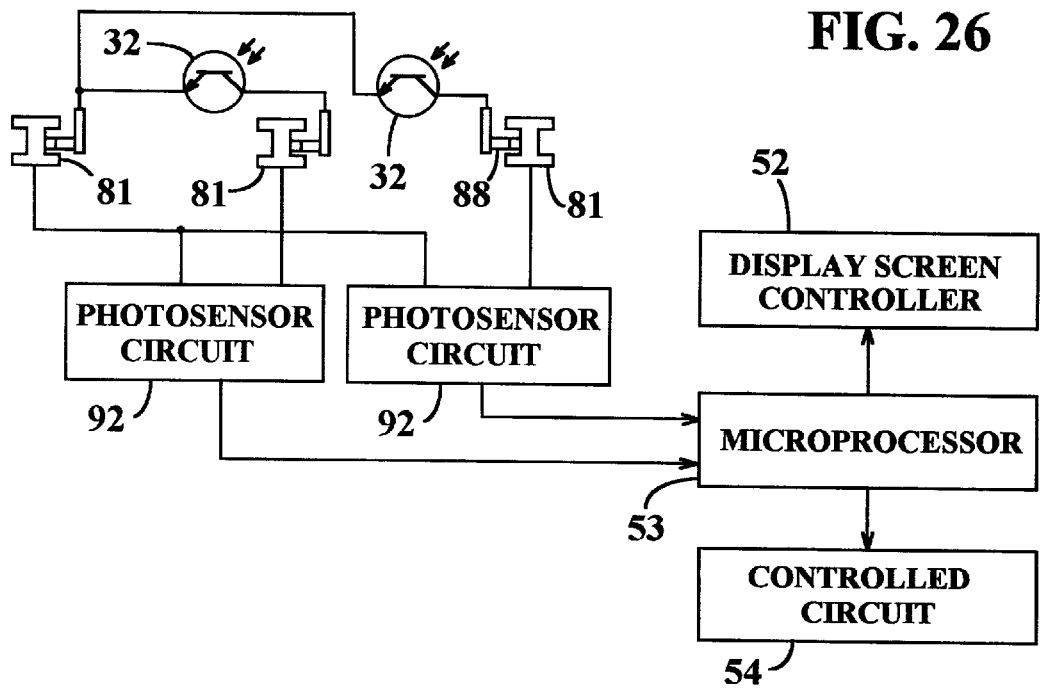
FIG. 26 depicts a modification of the circuit of FIG. 24 which increases resolution of detection of sliding movement of the slidable control.
Figure 27:
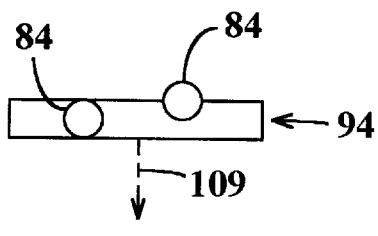
FIG. 27 diagramatically depicts a first arrangement of components which increases resolution in the apparatus of FIGS. 22 to 25.

Referring to FIG. 26, resolution of successive small movements of the sliding cap can be further increased if the cap carries more than one photosensor 32, there being two photosensors in this example. This requires that the control device 77a have three of the rails 81 and three of the wiper contacts 88 in order to electrically connect each photosensor 32 to its photosensor circuit 92. The location sensing signals produced by the photosensors 32 are delivered to the microprocessor 53 which is coupled to the display screen controller 52 and which transmits control signals to the controlled circuit 54 in the previously described manner. Referring jointly to FIGS. 26 and 27, the two photosensors 32 are spaced apart in a direction at right angles to the path of travel 109 of the scanning scan line 94. The resolution increasing effect in this example is realized by also spacing the photosensors 32 apart in the direction of travel 109. The spacing in this example is such that the viewing aperture 84 of one photosensor 32 is offset from the viewing aperture 84 of the other photosensor, in direction 109, by a distance corresponding to one half of the diameter of the viewing apertures. Consequently two location sensing signals are produced as the scan line 94 travels a distance that would otherwise produce only a single location sensing signal.

Figure 28:
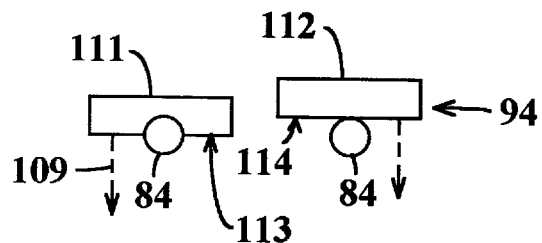
FIG. 28 diagramatically depicts an alternate arrangement of components which increases resolution in the apparatus of FIGS. 22 to 25.

Referring to FIGS. 26 and 28, a similar resolution increasing effect can be realized with the viewing apertures 84 of the two photosensors 32 in a strictly side by side relationship. In this arrangement, the display screen controller 52 is conditioned to travel a scan line 94 having two segments 111 and 112 through the viewing apertures 84 in a repetitive manner, each of the segments being viewed by a separate one of the photosensors 32. The leading edge 113 of one scan line segment 111 is offset, in the direction of travel 109, from the leading edge 114 of the other segment 112 by a distance equal to one half of the diameter of the viewing apertures 84.

Figure 29:
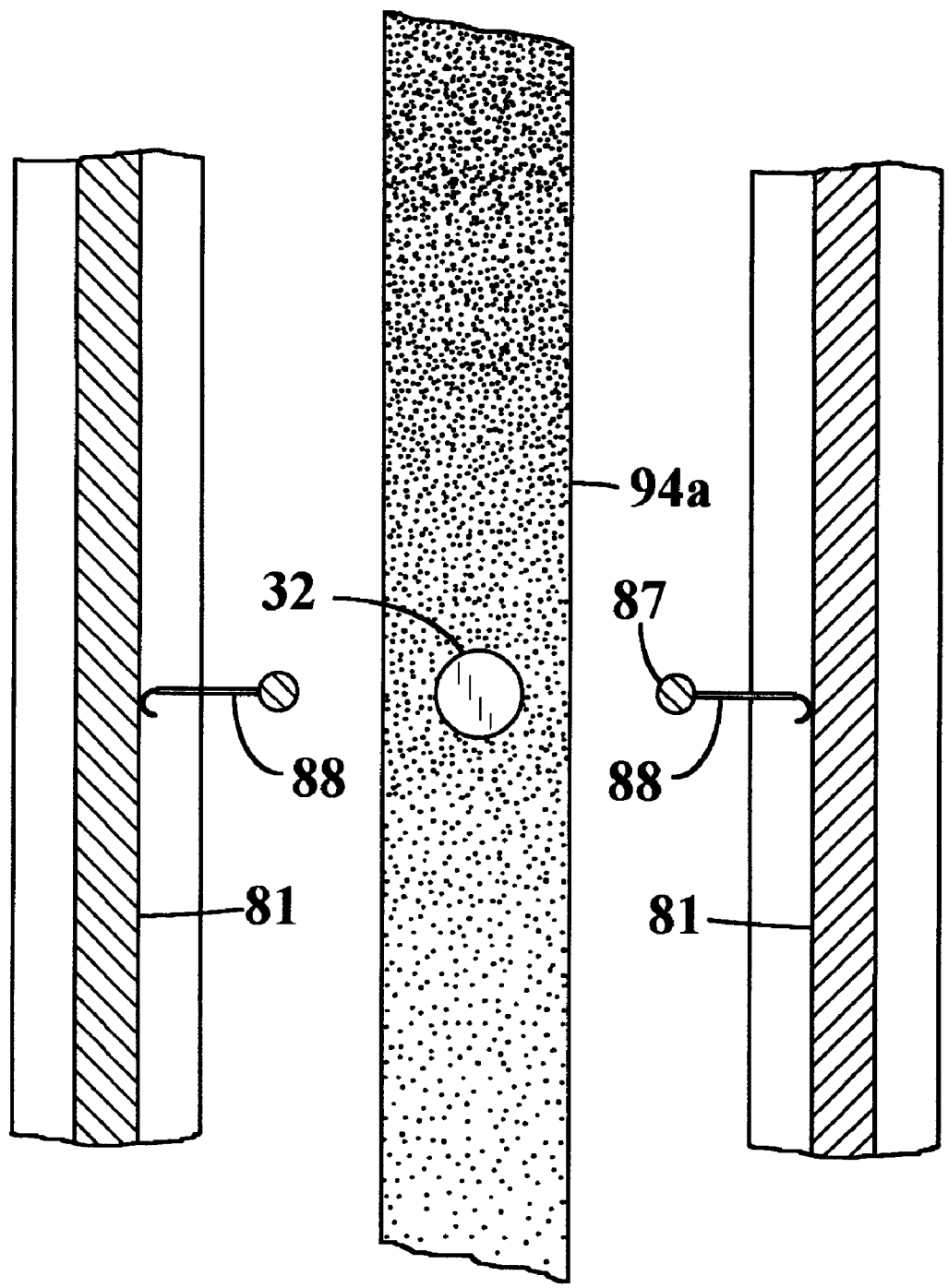
FIG. 29 is a view corresponding generally to FIG. 23 and illustrating an alternate light pattern display that may be used to track movement of a slidable knob.

A slidable cap control device having the physical construction previously described with reference to FIGS. 7, 22 and 23 may respond to variations in a light pattern that does not include a moving scan line 48. Referring to FIG. 29 in conjunction with FIGS. 7 and 22, the light pattern 94a may be one having a brightness which progressively changes along the length of the pattern. Thus the location sensing signal produced by the photosensor 32 has a magnitude which progressively changes as cap 78 is moved from setting to setting along the tracks 81 and may be used to vary the control signal which is produced by the control device in the manner which has been previously described with reference to the embodiment of FIG. 18.

Figure 30:
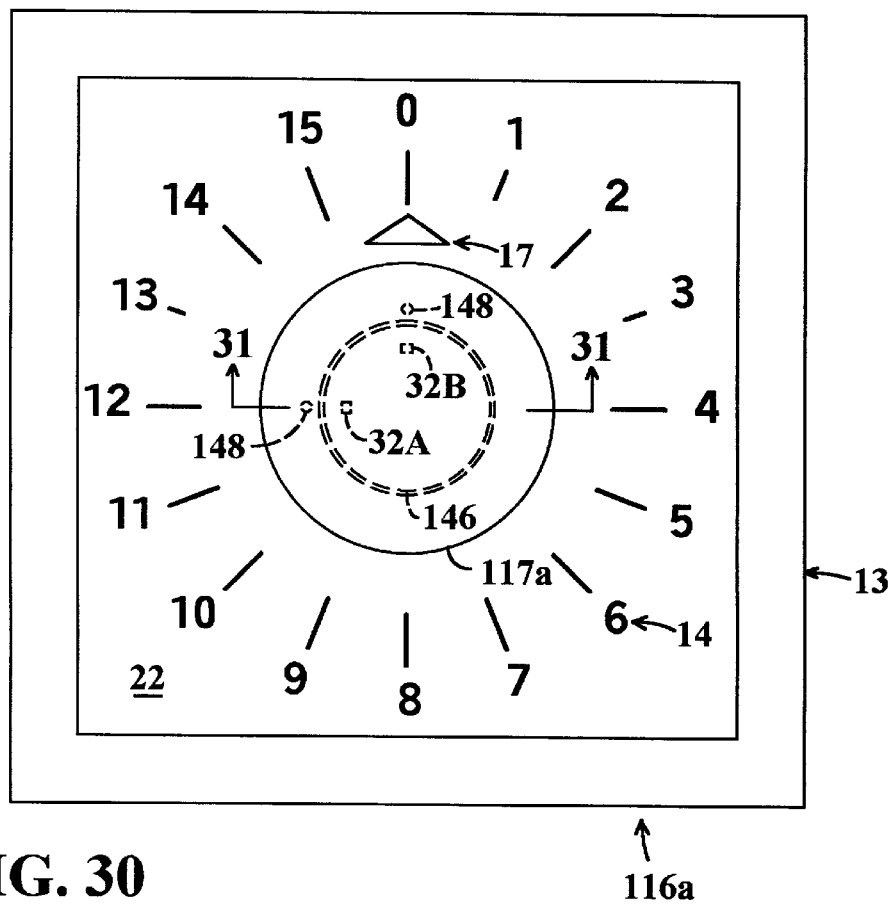
FIG. 30 is a frontal view of another control device for electrical apparatus which uses electronic display screen light for tracking operator turning of a knob.
Figure 31:
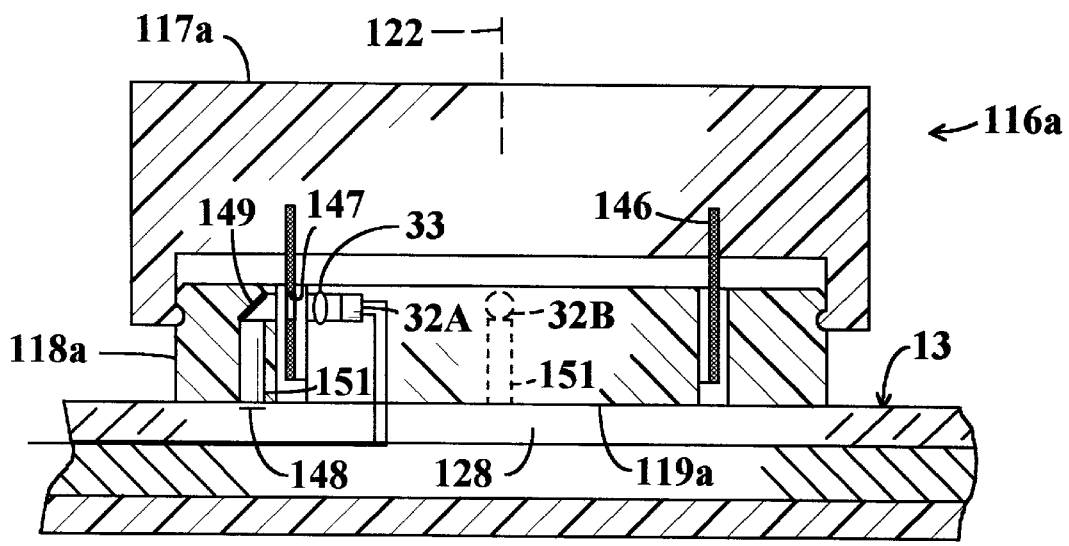
FIG. 31 is a cross section view taken along line 31—31 of FIG. 30.

Use of electronic display screen generated light for tracking operator movement of a control member is not limited to devices of the previously described kind in which a photosensor responds to light variations within a light pattern. A display screen, provided primarily for producing changeable graphics, may also function as the light source for photoelectric movement detection means of the kind that has heretofore required a light emitting diode or the like to produce light. This enables elimination of the light emitting diodes or other distinct light emitting components and the circuit complications which are attendant thereon. FIGS. 30 and 31 depict a circuit control device 116a of this kind.

Except as herein described, components of the control device 116a may be similar to those of the control device 116 previously described with reference to FIGS. 8 and 9. Thus, with reference jointly to FIGS. 30 and 31, the circuit control device 116a has a rotatable knob 117a snap engaged on an annular outer base member 118a which is secured to the face of an electronic display screen 13 within the image display area 22. The display screen displays images 14 around the periphery of the knob 117a that identify successive settings of the control device and also displays a virtual pointer image 17 that moves to identify the current setting of the control device 116a.

Data processor tracking of operator turning of knob 117a is enabled by a cylindrical encoding drum 146 which extends towards display screen 13 from the knob. Drum 146 is centered on the axis of rotation 122 of knob 117a and encircles an inner base member 119a that is secured to the face of the display screen 13. Referring to FIG. 32, light transmissive windows 147 in drum 146 are angularly spaced apart around the circumference of the otherwise opaque drum. The spacing of the windows from each other is equal to the breadth of the windows to provide for generation of a quadrature code as will hereinafter be described.

Referring again to FIGS. 30 and 31, photoelectric detection of operator turning of the knob 11a is enabled by conditioning the display screen 13 to display a pair of white areas 148 within a black background. The areas 148 are angularly spaced apart, by 90° in this particular example, relative the axis of rotation 122 of the knob 117a. A pair photosensors 32A and 32B of the previously described kind are disposed within the inner base member 119a and each views a separate one of a pair of mirrors 149 which are disposed in the outer base member 118a, through the windows 147 of the encoding drum 146. Mirrors 149 are oriented to reflect light from the white display screen areas 148 to photosensors 32A and 32B through focusing lenses 33 situated in the inner base member 119a. A light pipe or fibre optic 151 preferably extends from each white area 148 to the associated mirror 149 to provide for greater light intensity at the mirrors. Thus the output signal from each photosensor 32A, 32B switches between a low state when the photosensor is receiving light through a window 147 of the encoding drum 146 and a high state when light is blocked from the photosensor by an opaque portion of the drum.

Switching of the output voltages of the photosensors between the high and low states as the operator turns knob 117a enables digital data processor tracking of the amount of rotary movement and the direction of the rotary movement as the outputs jointly provide a quadrature code of the known kind. In FIGS. 33A to 33D, the output of photosensor 32A is designated "A" and the output of photosensor 32B is designated "B". At a first angular orientation of the encoding drum 146, shown in FIG. 33A, both photosensors 32A and 32B receive light and thus both outputs A and B are low. This provides what may be termed the 00 digital status. After an increment of clockwise turning of drum 146, light is blocked from photosensor 32B while photosensor 32A remains illuminated providing an 01 digital status as shown in FIG. 33B. Another increment of clockwise turning of the drum 146 blocks light from both photosensors 32A and 32B providing a 11 digital status as shown in FIG. 33C. Still another increment of the clockwise turning, shown in FIG. 33D, again illuminates photosensor 32B while light remains blocked from photosensor 32A creating the 10 digital status. Further clockwise turning of the drum 146 causes this sequence of digital status's to be repeated as long as the turning continues. Counterclockwise turning of the drum 146 generates a reversed sequence of the digital status's which is repeated as long as the counterclockwise turning continues.

Figure 34A:
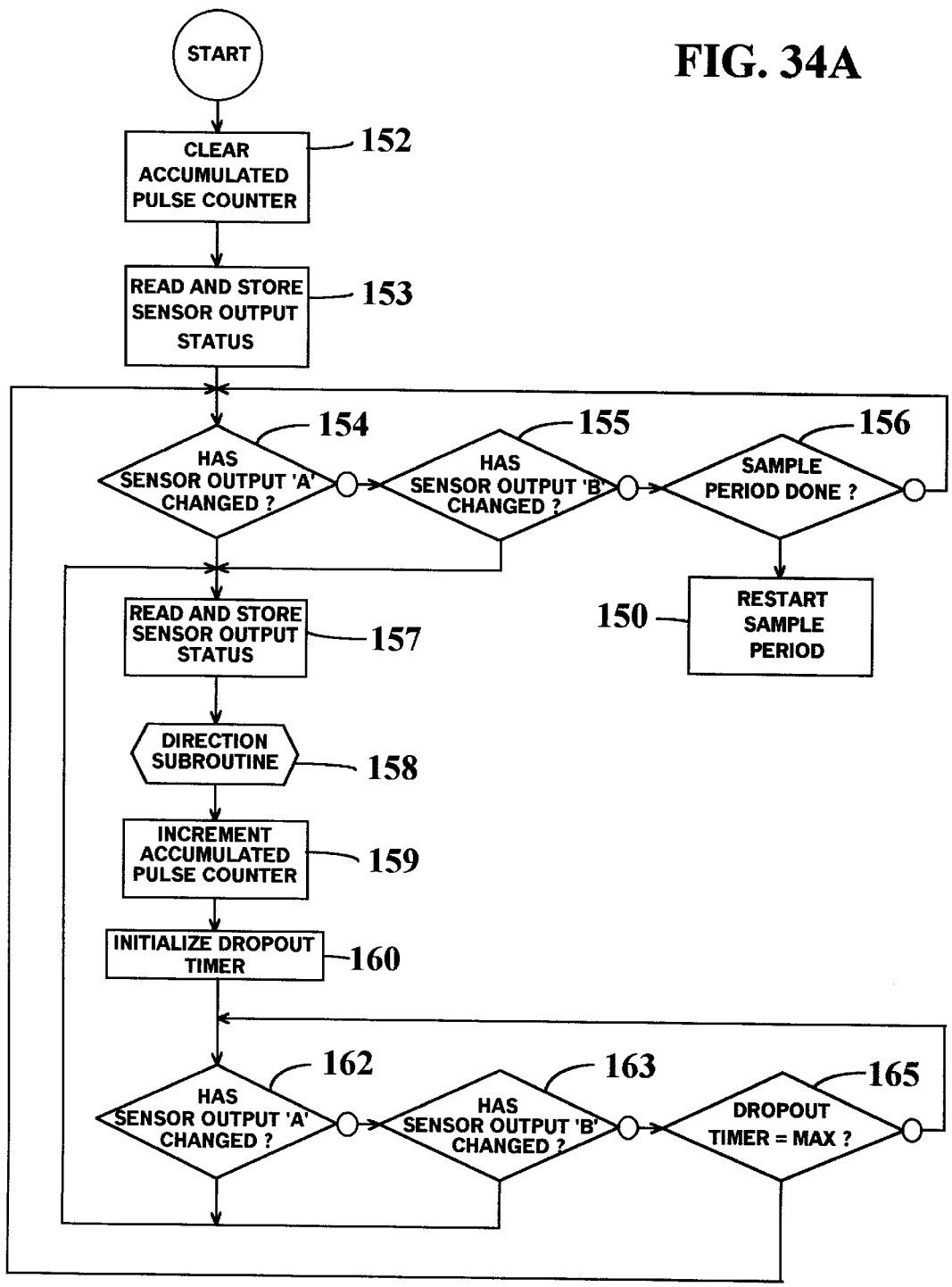
FIG. 34A is a flowchart depicting suitable programming for a digital data processing component of the control device of FIGS. 30 to 32.
Figure 34B:
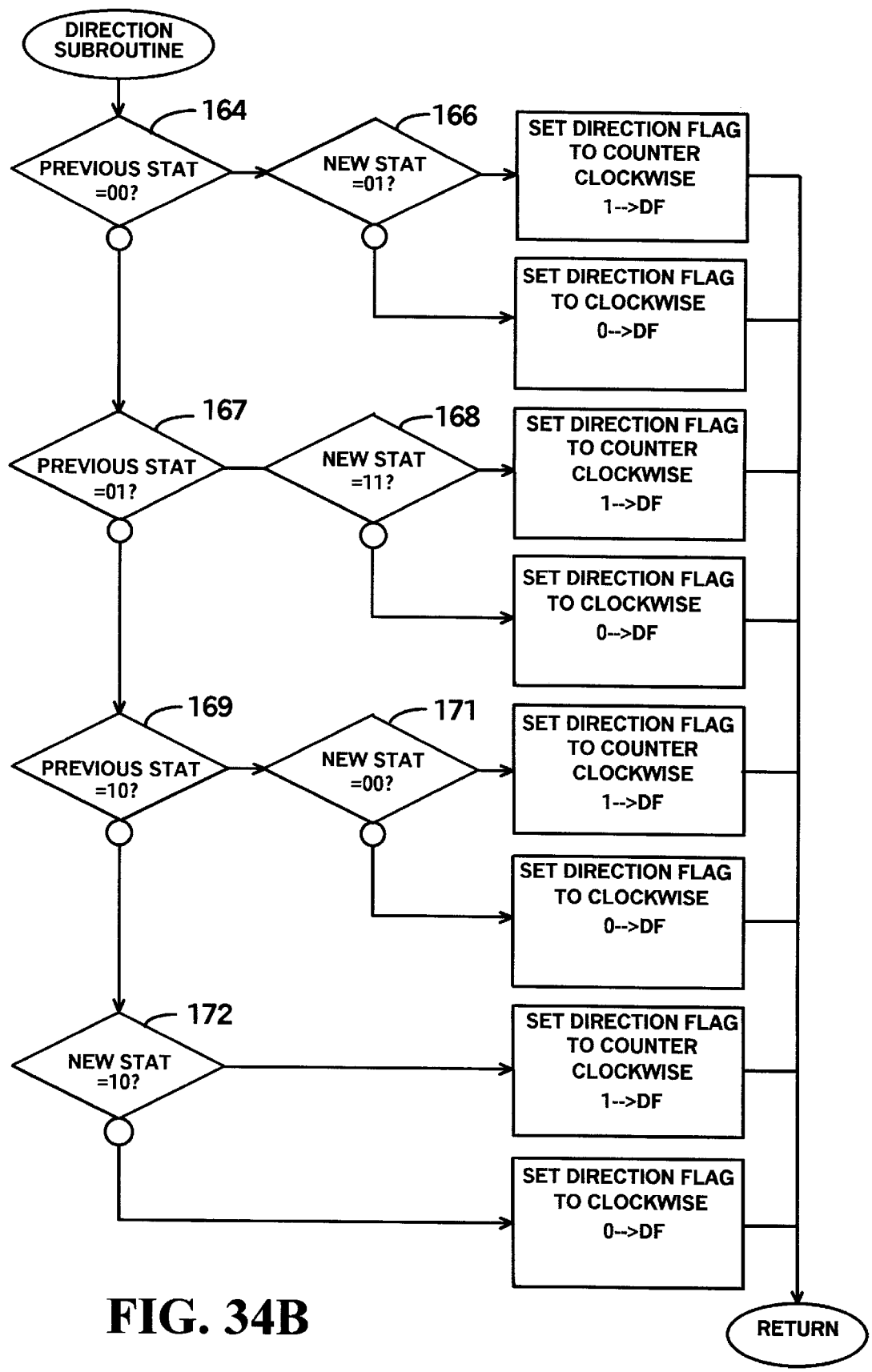
FIG. 34B is a flowchart depicting a subroutine which is part of the program shown in FIG. 27A.

FIGS. 34A and 34B depict a decoding program which enables digital data processor tracking of the amount of rotation and direction of rotation of the drum 146 for the purpose of varying the magnitude of the control signal which is outputted by the control device. The program repetitively checks the status of the photosensor outputs A and B and increments an accumulated pulse count in an additive or subtractive manner each time that the status changes from one of the conditions shown in FIGS. 33A to 33D to another status. The control signal which is outputted by the circuit control device and the position of the virtual pointer 17 shown in FIG. 30 is repetitively conformed with the current accumulated pulse count.

More particularly, with reference again to FIGS. 34A and 34B, the program clears the accumulated pulse count to a count of zero following start up as shown at box 152. This corresponds to the 0° setting of the rotary knob of the control device. Subsequently the program reads and stores the current status of the two photosensors, as indicated at box 153, to enable detection of any operator turning of the knob. If either sensor output A or sensor output B has changed the program again reads and stores the status of the sensor outputs as indicated at boxes 154, 155 and 157. If there has been no change in either sensor output the program checks to see if a pre-established sampling period has expired as indicated at box 156 and if it has not loops back to box 154 and again checks to see if there has been a change in the output of either sensor output. If the sampling period has expired without any change in either sensor output, the program restarts the sampling period and thus again loops back to box 154 and resumes checking of the sensor outputs.

When a change in the sensor outputs has caused a new sensor output status to be stored at box 157, the program executes a direction subroutine at box 158 to determine if the detected turning of the knob was in a clockwise or counterclockwise direction which subroutine will hereinafter be further discussed. As indicated at box 159 the accumulated pulse count is then incremented in an additive or subtractive manner depending on the direction of the knob movement. The program then starts a dropout timer as indicated at box 160 and resumes checking for a change in the outputs of the sensors as indicated at boxes 162 and 163 and 165. If a change in either sensor output is detected and the dropout timer period has not expired, the program loops back to box 157 and repeats the operations described above with reference to boxes 157, 158 and 159. If the dropout timer period expires before a change in either sensor output is detected the program loops back to box 154.

The direction subroutine 158 is depicted in FIG. 34B. Referring jointly to FIGS. 34B and 33A to 33D, if the previous digital status of the sensor outputs is the 00 status and a new status is 01 as indicated at boxes 164 and 166, then the program sets the directional flag to counterclockwise. The directional flag is set to clockwise if the new status is not 01. Referring to boxes 167 and 168, the direction flag is set to counterclockwise if the previous status is 01 and the new status is 11. If the new status is not 11, than the flag is set to clockwise. Referring to boxes 169 and 171, the direction flag is set to counterclockwise if the previous digital status is 10 and the new status is 00. If the new status is not 00, than the flag is set to clockwise. As shown at box 172, the direction flag is set to counterclockwise if the previous status is not 10 and the new status is 10. The flag is set to clockwise if the previous status is not 10 and the new status is also not 10. Following determination of the direction of knob movement in this manner, the program returns to box 159 of FIG. 34A Referring again to FIGS. 30 and 31, the detailed construction of the rotary knob circuit control device 116a may differ in a variety of ways from the specific embodiment which has been described. For example, the angled mirrors 149 are not needed if, as shown in FIG. 35, the linear light pipes or fibre optics 151 are replaced with light pipes 151a which are curved to transmit light 148 from the display screen 13 directly into the windows 147 of light encoding drum 146. As another example of variations of the control device, the light encoding drum 146 need not have the light transmissive windows 147 if, as shown in FIG. 36 it is replaced with a drum 146a having light reflective mirrors 147a at the locations of the windows. The mirrors 147a face towards the axis of rotation of drum 146a in this example. A pair of curved light pipes 151a which extend within the inner base member 119a direct light generated by the display screen 13 towards the inner surface of the drum 146a. The light pipes 151a are oriented to direct the light along light paths 176 which intersect the drum 146a at an angle smaller than a 90° angle and are positioned to cause the light paths to intersect the drum at the same location that the light paths intersect the drum in the previously described embodiment. Photosensors 32A and 32B and focusing lenses 33 are situated in the inner base member 119a and are positioned to receive light which is reflected by mirrors 147a when the mirrors are traveled into the light paths 176. The control device of FIG. 36 may otherwise be similar to that of FIGS. 30 to 34B and may operate in a similar manner.

The light encoding drum 146 need not necessarily be configured to create a quadrature code of the above described kind as the knob of the control device is turned. Other ways of varying a control signal in response to turning of the drum are possible. For example, with reference to FIG. 37, the drum 146*b* may have a light transmissivity that progressively increases or decreases at successive locations around the circumference of the drum. This causes the output voltage of photosensor 32 to progressively increase or decrease as the knob 117 is turned between it successive settings. The output of the photosensor 32 may be used directly as a control signal for a controlled circuit or may be amplified and used for that purpose or may be processed in an analog to digital converter in order to control a digital circuit. A control device 116*c* of this kind does not necessarily require more than one photosensor 32. Except as herein described, the physical construction of the control device 116*c* of FIG. 37 may be similar to that of the embodiment of FIGS. 30 and 31.

While the invention has been described with respect to certain specific embodiments for purposes of example, many other modifications and variations are possible and it is not intended to limit the invention except as defined in the following claims.

We claim:

1. A control device for providing a control signal to electrical apparatus wherein at least one photosensor in said control device detects movement of a moveable member which photosensor responds to light produced by a light source, wherein the improvement comprises:

said control device being disposed in front of an electronic image display screen within an image display area thereof which display screen displays changeable images conveying information pertinent to operation of the control device, said display screen also being said light source, further including a display screen controller coupled to said image display screen and being conditioned to cause display of a light pattern at said image display area which light pattern is viewed by said photosensor, said moveable member being positionable to cause said photosensor to view any of a plurality of locations in said light pattern and wherein said photosensor produces a location sensing signal in response to light produced by the display screen at a selected location in the light pattern, and, a digital data processor receiving said location sensing signal and being conditioned to vary the value of said control signal in response to location sensing signals originating from different ones of said locations in said light pattern.

2. The control device of claim 1 including a plurality of said photosensors each being positioned to view a different region of said light pattern.

3. A control device for providing a control signal to electrical apparatus wherein at least one photosensor in said control device detects movement of a moveable member which photosensor responds to light produced by a light source, wherein the improvement comprises:

said control device being disposed in front of an electronic image display screen within an image display area thereof which display screen displays changeable images conveying information pertinent to operation of the control device, said display screen also being said light source, further including a display screen controller coupled to said image display screen and being conditioned to cause display of a light pattern wherein different locations in said light pattern are viewed by said photosensor as said moveable member is moved through settings thereof, said display screen controller being further conditioned to move a light variation through the locations in said light pattern which light variation is detectable by said photosensor to produce a location sensing signal.

4. The control device of claim 3 wherein said display screen controller is conditioned to scan said light variation repetitively through said locations.

5. The control device of claim 3 wherein said display screen controller is conditioned to scan said light variation constantly through said locations.

6. The control device of claim 3 further including a touch sensing circuit connected to produce a touch signal in response to manipulation of said moveable member further including a digital data processor connected to said touch sensing circuit and to said display screen controller and being conditioned to initiate said movement of said light variation in response to said touch signal.

7. A control device for providing a control signal to electrical apparatus wherein at least one photosensor in said control device detects movement of a moveable member which photosensor responds to light produced by a light source, wherein the improvement comprises:

said control device being disposed in front of an electronic image display screen within an image display area thereof which display screen displays changeable images conveying information pertinent to operation of the control device, said display screen also being said light source, wherein said moveable member is a stylus having an end which may be placed at a selected location in front of said image display area, said photosensor being secured to said stylus and being oriented to view a portion of said image area of said display that is offset from said end of said stylus, said end of said stylus defining an axis of rotation about which said stylus may be turned and wherein said photosensor is positioned on said stylus to view selected locations on said image display area that lie along a path which extends around said axis of rotation.

8. The control device of claim 7 further including a display screen controller coupled to said image display screen and being conditioned to cause display of an image which extends around the stylus wherein successive locations in said image are viewed by said photosensor when said end of said stylus is placed thereat and said stylus is turned, said display screen controller being further conditioned to move a light variation through successive locations in said image which light variation is detectable by said photosensor to produce a location sensing signal indicative of the current angular orientation of said stylus.

9. The control device of claim 8 wherein said successive locations in said image are substantially equidistant from a position in said image at which said end of said stylus is emplaced to enable viewing of said locations by said photosensor as said stylus is turned, said display screen controller being conditioned to cause display of a visible identification of said position in said image.

10. The control device of claim 8 wherein said display screen controller is conditioned to move a scan line image along a path extending through said locations in said image, said scan line image having an optical characteristic which is detectable by said photosensor.

11. The control device of claim 10 further including a digital data processor coupled to said photosensor and to said display screen controller, said digital data processor having means for storing a changeable first value which identifies the last setting of said control device, means for storing a second value which is indicative of the current position of said scan line image along said path as determined by the position of the photosensor, means for conforming said first value with said second value in response to said location sensing signals, and means for varying said control signal in response to variations of said first value.

12. A control device for providing a control signal to electrical apparatus wherein at least one photosensor in said control device detects movement of a moveable member which photosensor responds to light produced by a light source, wherein the improvement comprises:

said control device being disposed in front of an electronic image display screen within an image display area thereof which display screen displays changeable images conveying information pertinent to operation of the control device, said display screen also being said light source, wherein said moveable member is a stylus having an end which may be placed at a selected location in front of said image display area, said photosensor being secured to said stylus and being oriented to view a portion of said image area of said display that is offset from said end of said stylus.

\* \* \* \* \*